(12) United States Patent
Chang

(10) Patent No.: US 8,693,253 B2
(45) Date of Patent: Apr. 8, 2014

(54) VERTICALLY STACKABLE NAND FLASH MEMORY

(75) Inventor: Chun-Yen Chang, Baoshan Township, Hsinchu County (TW)

(73) Assignee: Design Express Limited, Tortola (VG)

( * ) Notice: Subject to any disclaimer, the term of this patent is extended or adjusted under 35 U.S.C. 154(b) by 80 days.

(21) Appl. No.: 13/460,256

(22) Filed: Apr. 30, 2012

(65) Prior Publication Data

US 2013/0286734 A1    Oct. 31, 2013

(51) Int. Cl.
*G11C 16/04* (2006.01)

(52) U.S. Cl.
USPC .............. 365/185.17; 365/63; 365/185.11

(58) Field of Classification Search
USPC ................. 365/63, 185, 11, 185.17
See application file for complete search history.

(56) References Cited

U.S. PATENT DOCUMENTS

| | | | |
|---|---|---|---|
| 2009/0203178 A1* | 8/2009 | Kim et al. | 438/287 |
| 2009/0231942 A1* | 9/2009 | Lee et al. | 365/230.01 |
| 2010/0265773 A1* | 10/2010 | Lung et al. | 365/185.27 |

OTHER PUBLICATIONS

Jiyoung Kim et al., "Novel Vertical-Stacked-Array-Transistor (VSAT) for ultra-high-density and cost-effective NAND Flash memory devices and SSD (Solid State Drive)," Symposium on VLSI Technology Digest of Technical Papers, pp. 186-187, 2009.

Wonjoo Kim et al., "Multi-Layered Vertical Gate NAND Flash Overcoming Stacking Limit for Terabit Density Storage," Symposium on VLSI Technology Digest of Technical Papers, pp. 188-189, 2009.

Jaehoon Jang et al., "Vertical Cell Array using TCAT(Terabit Cell Array Transistor) Technology for Ultra High Density NAND Flash Memory," Symposium on VLSI Technology Digest of Technical Papers, pp. 192-193, 2009.

Ryota Katsumata et al., "Pipe-shaped BiCS Flash Memory with 16 Stacked Layers and Multi-Level-Cell Operation for Ultra High Density Storage Devices," Symposium on VLSI Technology Digest of Technical Papers, pp. 192-193, 2009.

* cited by examiner

*Primary Examiner* — Hoai V Ho
(74) *Attorney, Agent, or Firm* — Ming Chow; Sinorica, LLC

(57) ABSTRACT

A NAND flash memory includes a plurality of NAND flash memory structures separated by an insulating layer. In one embodiment of the present disclosure, the NAND flash memory structure includes a first bitline extending along a first direction, a first charge-trapping region positioned over the first bitline, a wordline positioned over the first charge-trapping region and extending along a second direction, a second charge-trapping region positioned over the wordline, and a second bitline positioned over the second charge-trapping region, wherein the first charge-trapping region and the second charge-trapping region are stacked along a third direction substantially perpendicular to the first direction and the second direction.

14 Claims, 40 Drawing Sheets

VERTICALLY STACKABLE NAND FLASH MEMORY

TECHNICAL FIELD

The present disclosure relates to a NAND flash, and more particularly, to a NAND flash memory capable of being vertically stacked to increase the memory capacity.

BACKGROUND ART

Flash memory has been widely applied to the data storage of digital products such as laptop computers, personal digital assistants, cellular telephones, digital cameras, digital recorders, and MP3 players. In order to keep up with customer demand for low-priced, efficient, small devices with high capacity, there is a growing need for highly integrated semiconductor memories. Accordingly, the use of 3-dimensional designs has been proposed for semiconductor memories. For example, conventional 3-dimensional memory designs such as Pipe-shaped Bit Cost Scalable (P-BiCS), Vertical Cell Array using TCAT (Terabit Cell Array Transistor), Vertical-Stacked-Array-Transistor (VSAT), and Vertical Gate NAND (VG-NAND) have been proposed to meet the growing need for highly integrated semiconductor memories.

However, there is a limitation on the conventional 3-dimensional memory designs. The conventional NAND flash memory cell uses the ONO (oxide-nitride-oxide) stack as the charge-trapping structure, wherein the oxide closest to the bitline determines the retention time, while the oxide closest to the wordline determines the tunneling selectivity, and the intervening nitride determines the charge-trapping capacity. In other words, the thickness of the ONO stack serving as the charge-trapping structure is not a scalable parameter, and the it is not feasible to increase the memory density of the conventional 3-dimensional memory designs by decreasing the thickness of the ONO stack. In addition, the conventional 3-dimensional memory designs implement the charge-trapping structure by the ONO stack laterally, requiring a very complicated fabrication process.

SUMMARY

One aspect of the present disclosure provides a NAND flash memory structure capable of being vertically stacked to increase the memory capacity.

One embodiment of the present disclosure provides a NAND flash memory, comprising at least one memory structure including a first bitline extending along a first direction; a first charge-trapping region positioned over the first bitline; a wordline positioned over the first charge-trapping region and extending along a second direction; a second charge-trapping region positioned over the wordline; and a second bitline positioned over the second charge-trapping region; wherein the first charge-trapping region and the second charge-trapping region are stacked along a third direction substantially perpendicular to the first direction and the second direction.

The conventional 3-dimensional memory designs implement the charge-trapping structure by the ONO stack laterally, requiring a very complicated fabrication process. In contrast, in one embodiment of the present disclosure, the charge-trapping structure is vertically aligned, allowing a relatively simple fabrication process.

The thickness of the ONO stack serving as the charge-trapping structure is not a scalable parameter, and the it is not feasible to increase the memory density of the conventional 3-dimensional memory designs by decreasing the thickness of the ONO stack. In contrast, in one embodiment of the present disclosure, the charge-trapping structure is implemented in a vertically aligned manner, allowing repeating of the fabrication process to increase the memory capacity.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

The objectives and advantages of the present disclosure are illustrated with the following description and upon reference to the accompanying drawings in which.

DETAILED DESCRIPTION

Figure 1:
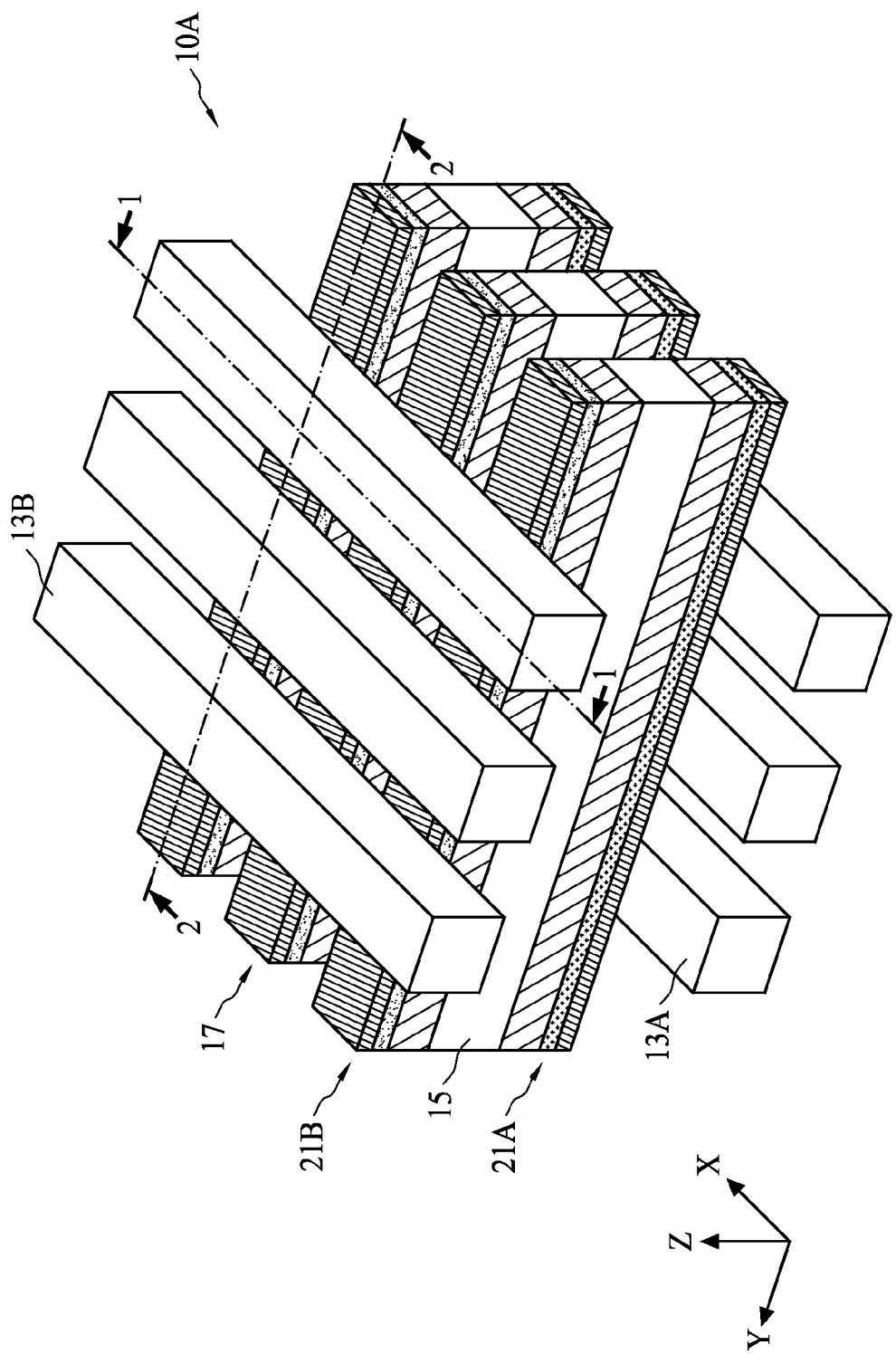
FIG. 1 illustrates a full view of a NAND flash memory structure according to one embodiment of the present disclosure.

FIG. 1 illustrates a full view of a NAND flash memory structure 10A according to one embodiment of the present disclosure. For clearance purposes, the isolation material is omitted in FIG. 1. In one embodiment of the present invention, the NAND flash memory structure 10A comprises a plurality of first bitlines 13A, a plurality of second bitlines 13B, and a plurality of separated lines 17 between the first bitlines 13A and the second bitlines 13B. In one embodiment of the present invention, both the first bitlines 13A and the second bitlines 13B extend along a first direction substantially in a horizontal manner, and the separated lines 17 extend along a second direction substantially in a horizontal manner. In one embodiment of the present invention, the separated line 17 comprises a first charge-trapping stack 21A, a second charge-trapping stack 21B, and a wordline 15 positioned between the first charge-trapping stack 21A and the second charge-trapping stack 21B.

Figure 2:
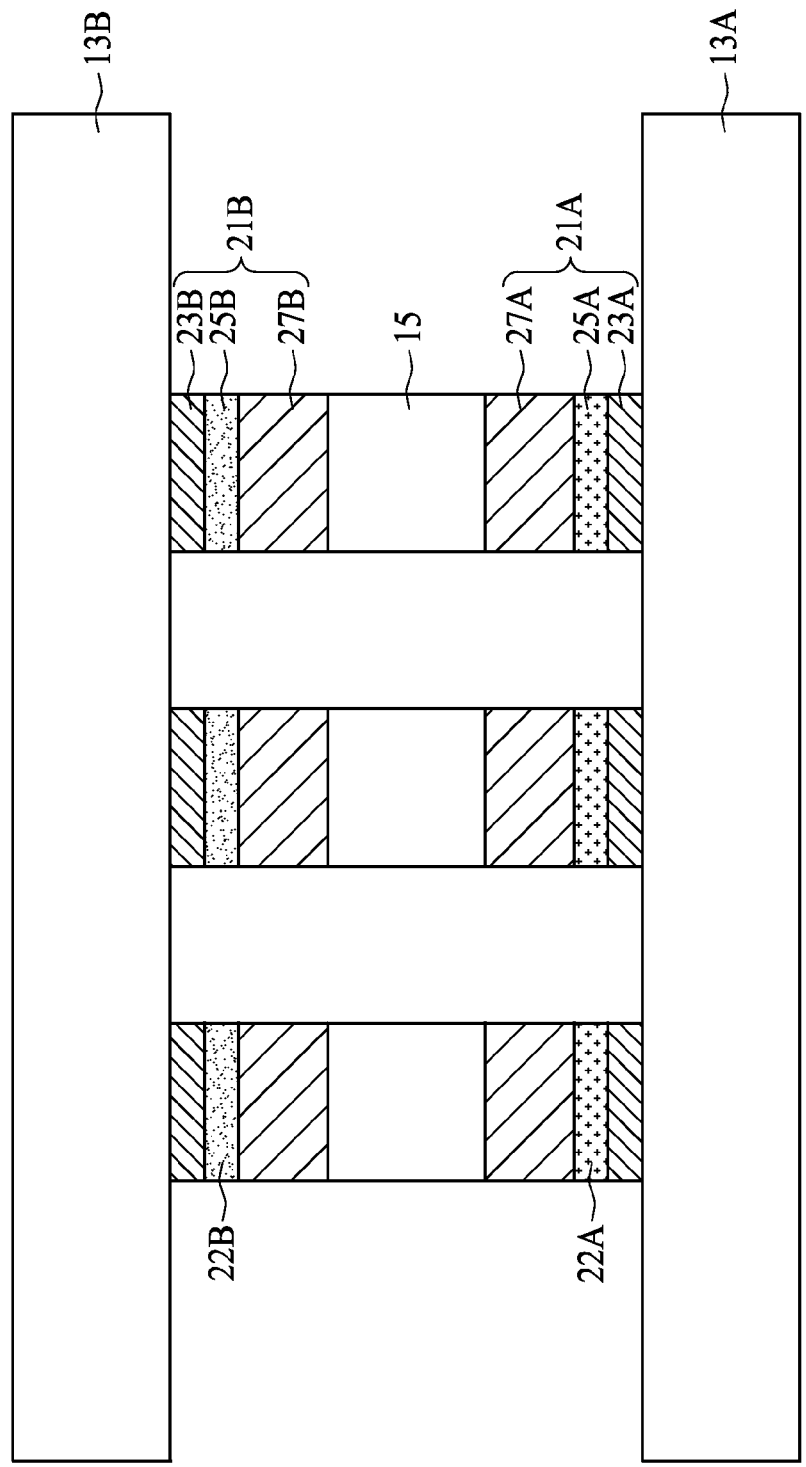
FIG. 2 illustrates a sectional view along line 1-1 in FIG. 1 according to one embodiment of the present disclosure.

FIG. 2 illustrates a sectional view along line 1-1 in FIG. 1 according to one embodiment of the present disclosure. For clearance purposes, the isolation material is omitted in FIG. 2. In one embodiment of the present invention, the first charge-trapping stack 21A and the second charge-trapping stack 21B are arranged in a symmetrical manner with respect to the wordline 15. In one embodiment of the present invention, the first charge-trapping stack 21A comprises a first dielectric layer 23A, a second dielectric layer 27A, and an intervening layer 25A between the first dielectric layer 23A and the second dielectric layer 27A, wherein the intervening layer 25A is a dielectric layer or a quantum dot layer. In one embodiment of the present invention, the first dielectric layer 23A and the second dielectric layer 27A are oxide layers, and the intervening layer 25A is a nitride layer. In one embodiment of the present invention, the quantum dot layer is implemented by a first material serving as a matrix and a second material serving as dots embedded in the matrix, wherein the energy gap of the first material is greater than that of the second material. In one embodiment of the present invention, the thickness of the first dielectric layer 23A is less than that of the second dielectric layer 27A.

In one embodiment of the present invention, the second charge-trapping stack 21B comprises a first dielectric layer 23B, a second dielectric layer 27B, and an intervening layer 25B between the first dielectric layer 23B and the second dielectric layer 27B, wherein the intervening layer 25B is a dielectric layer or a quantum dot layer. In one embodiment of the present invention, the first dielectric layer 23B and the second dielectric layer 27B are oxide layers, and the intervening layer 25B is a nitride layer. In one embodiment of the present invention, the quantum dot layer is implemented by a first material serving as a matrix and a second material serving as dots embedded in the matrix, wherein the energy gap of the first material is greater than that of the second material. In one embodiment of the present invention, the thickness of the first dielectric layer 23A is less than that of the second dielectric layer 27A.

Figure 3:
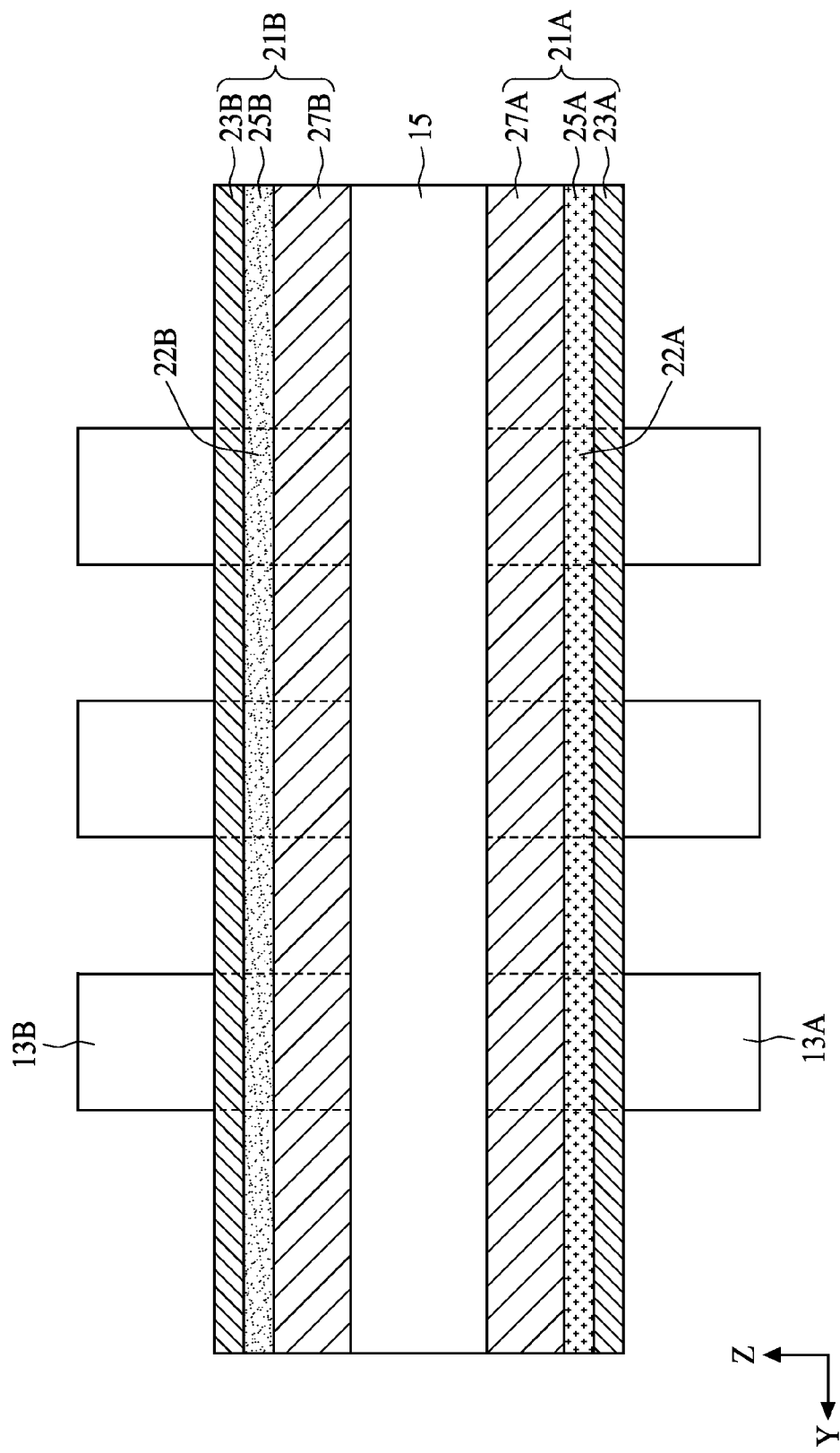
FIG. 3 illustrates a sectional view along line 2-2 in FIG. 1 according to one embodiment of the present disclosure.

FIG. 3 illustrates a sectional view along line 2-2 in FIG. 1 according to one embodiment of the present disclosure. For clearance purposes, the isolation material is omitted in FIG. 3. In one embodiment of the present invention, the first charge-trapping stack 21A comprises a plurality of first charge-trapping regions 22A, and the first charge-trapping region 22A is positioned in the first charge-trapping stack 21A between the wordline 15 and one of the first bitlines 13A. In one embodiment of the present invention, the second charge-trapping stack 21B comprises a plurality of second charge-trapping regions 22B, and the second charge-trapping region 22B is positioned in the second charge-trapping stack 21B between the wordline 15 and one of the second bitlines 13B.

In one embodiment of the present invention, the first charge-trapping region 22A and the second charge-trapping region 22B are stacked along a third direction, which is substantially perpendicular to the first direction, as shown in FIG. 2. In one embodiment of the present invention, the first charge-trapping region 22A and the second charge-trapping region 22B are stacked along the third direction, which is substantially perpendicular to the second direction, as shown in FIG. 3.

Referring to FIG. 3, in one embodiment of the present invention, the first bitline 13A and the second bitline 13B are aligned vertically, i.e., aligned along the third direction. Similarly, in one embodiment of the present invention, the first charge-trapping region 22A and the second charge-trapping region 22B are aligned vertically, i.e., aligned along the third direction. In one embodiment of the present invention, the space between the first bitlines 13A is between 20 nm and 25 nm. In one embodiment of the present invention, the memory structure 10A comprises a first carrier channel positioned substantially in a horizontal manner in the first bitline 13A close to the first charge-trapping stack 21A, and a second carrier channel positioned substantially in a horizontal manner in the second bitline 13B close to the second charge-trapping stack 21B.

Figure 4:
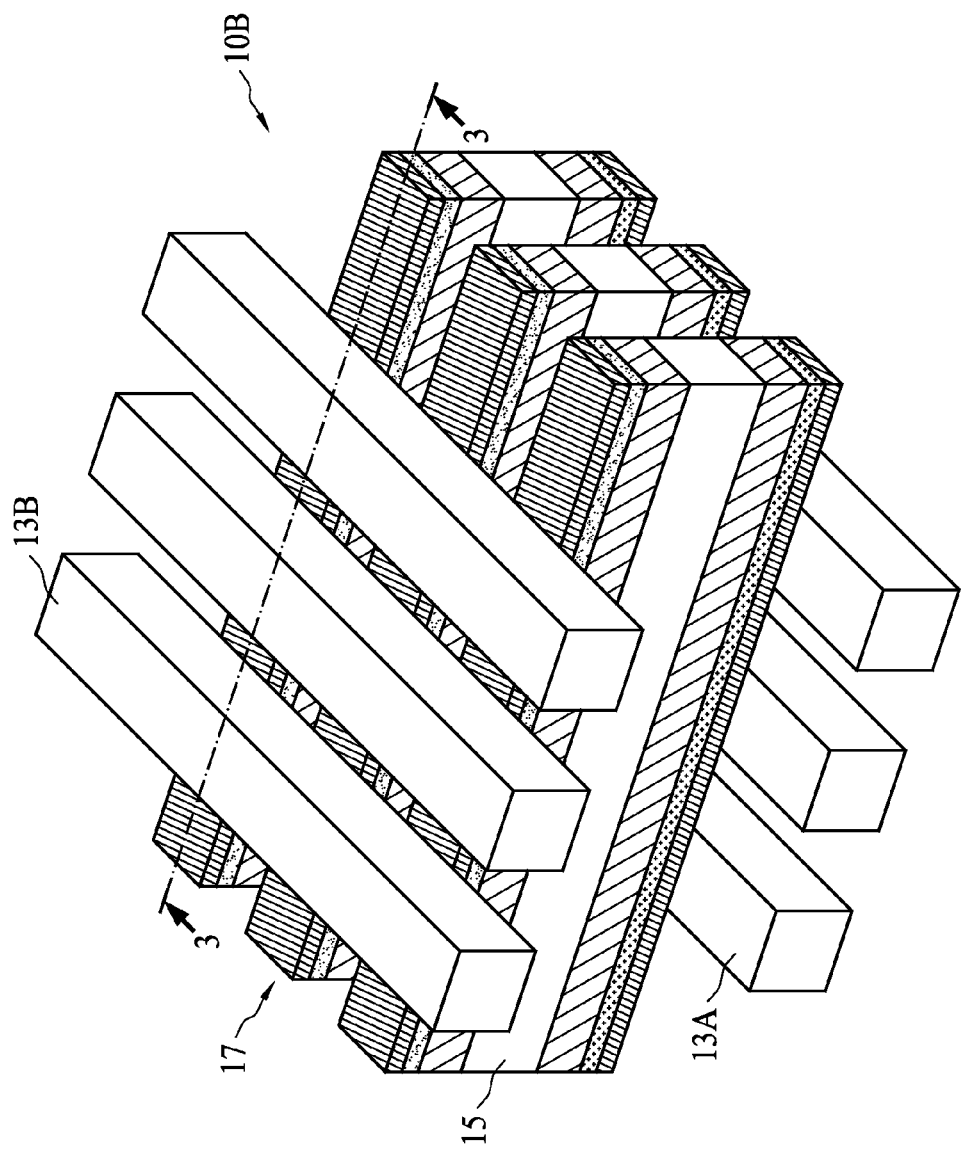
FIG. 4 illustrates a full view of a NAND flash memory structure according to one embodiment of the present disclosure.
Figure 5:
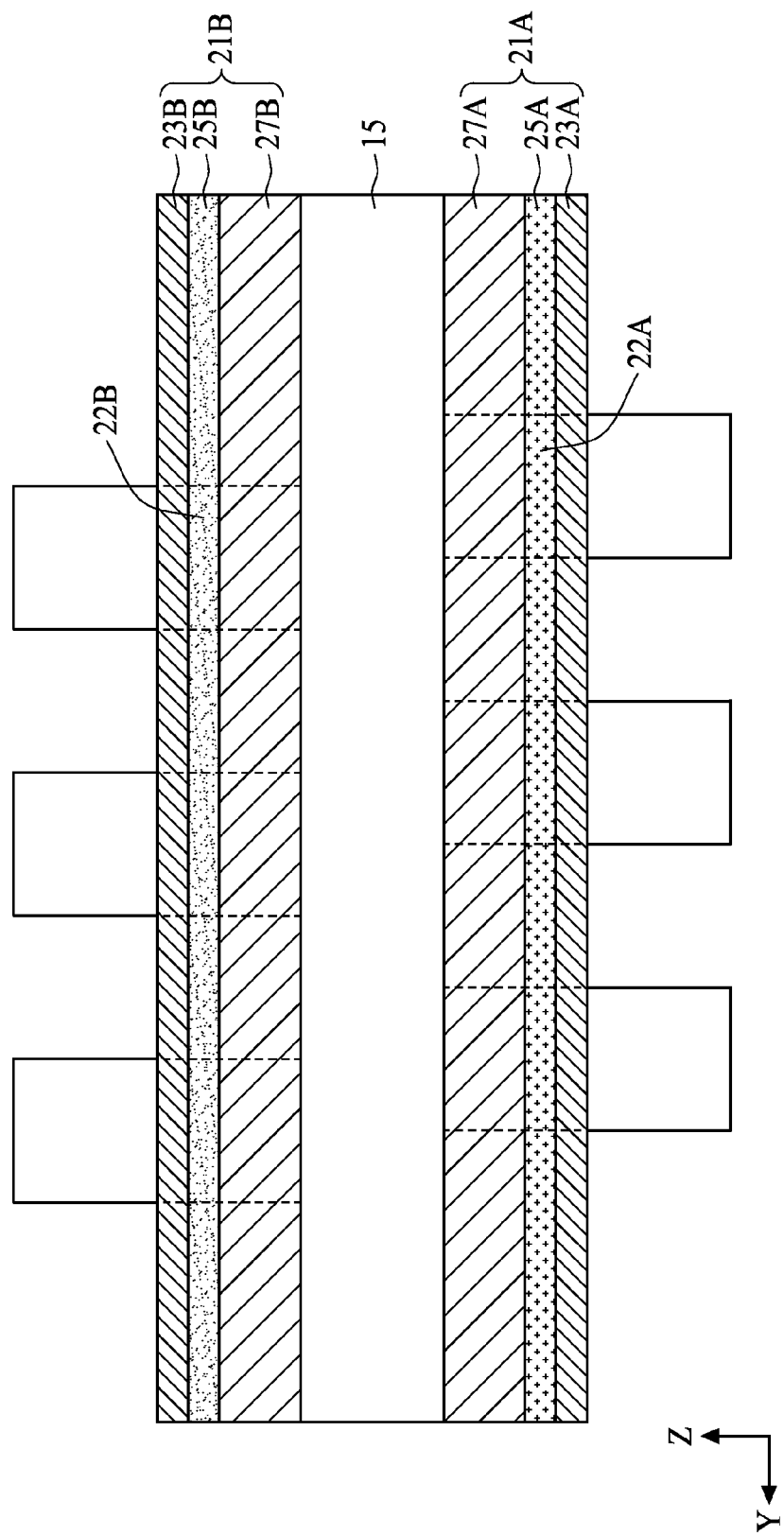
FIG. 5 illustrates a sectional view along line 3-3 in FIG. 4 according to one embodiment of the present disclosure.

FIG. 4 illustrates a full view of a NAND flash memory structure 10B according to one embodiment of the present disclosure, and FIG. 5 illustrates a sectional view along line 3-3 in FIG. 4 according to one embodiment of the present disclosure. For clearance purposes, the isolation material is omitted in FIG. 4 and FIG. 5. In FIG. 3, the first bitline 13A and the second bitline 13B are aligned vertically; in contrast, in FIG. 4 the first bitline 13A and the second bitline 13B are positioned in a staggered manner along the third direction. Furthermore, in FIG. 3, the first charge-trapping region 22A and the second charge-trapping region 22B are aligned vertically, whereas in FIG. 4 the first charge-trapping region 22A and the second charge-trapping region 22B are positioned in a staggered manner along the third direction.

Figure 6:
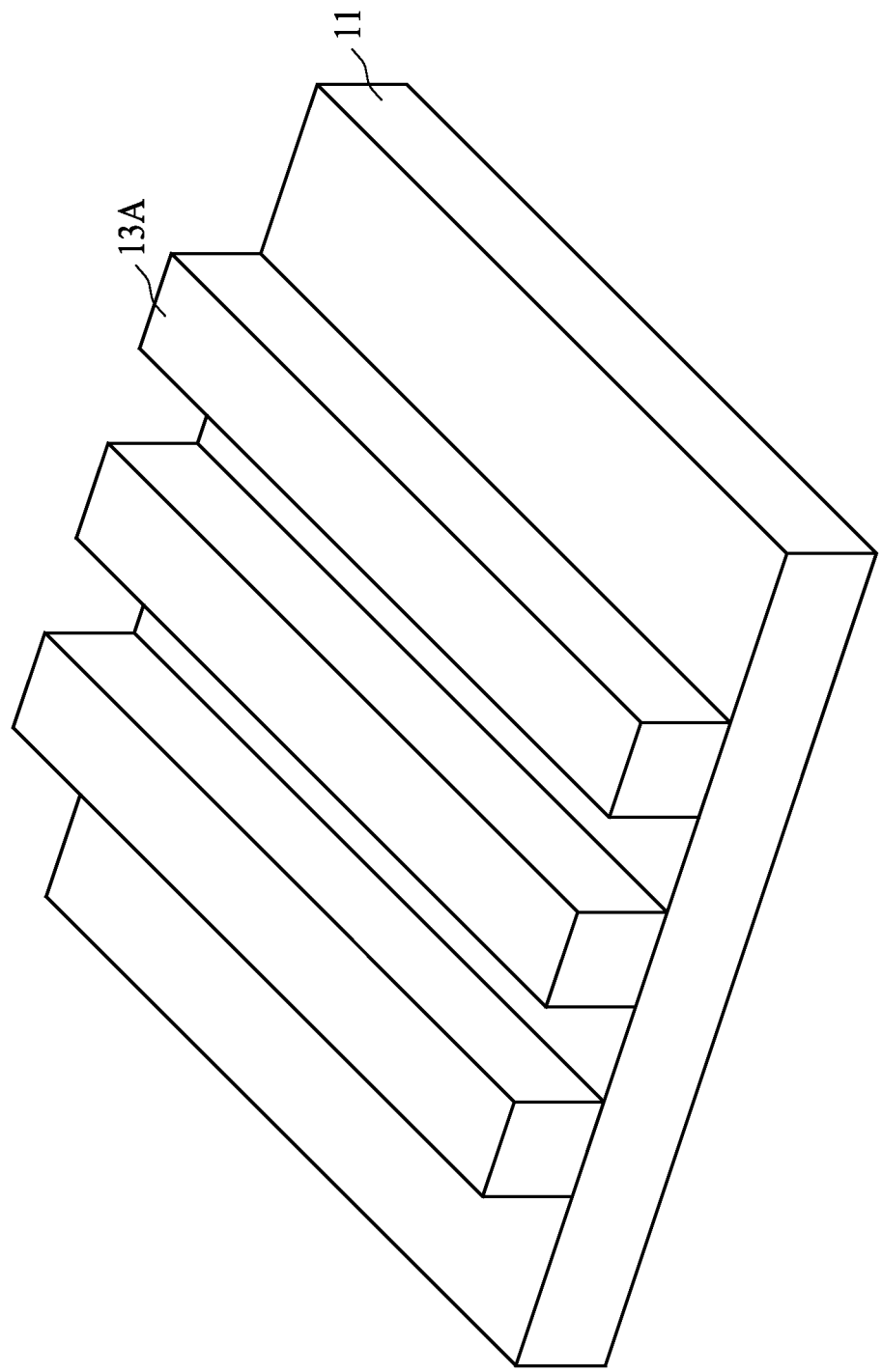
FIG. 6 to FIG. 8 illustrate a method for preparing the NAND flash memory structure according to one embodiment of the present disclosure.
Figure 7:
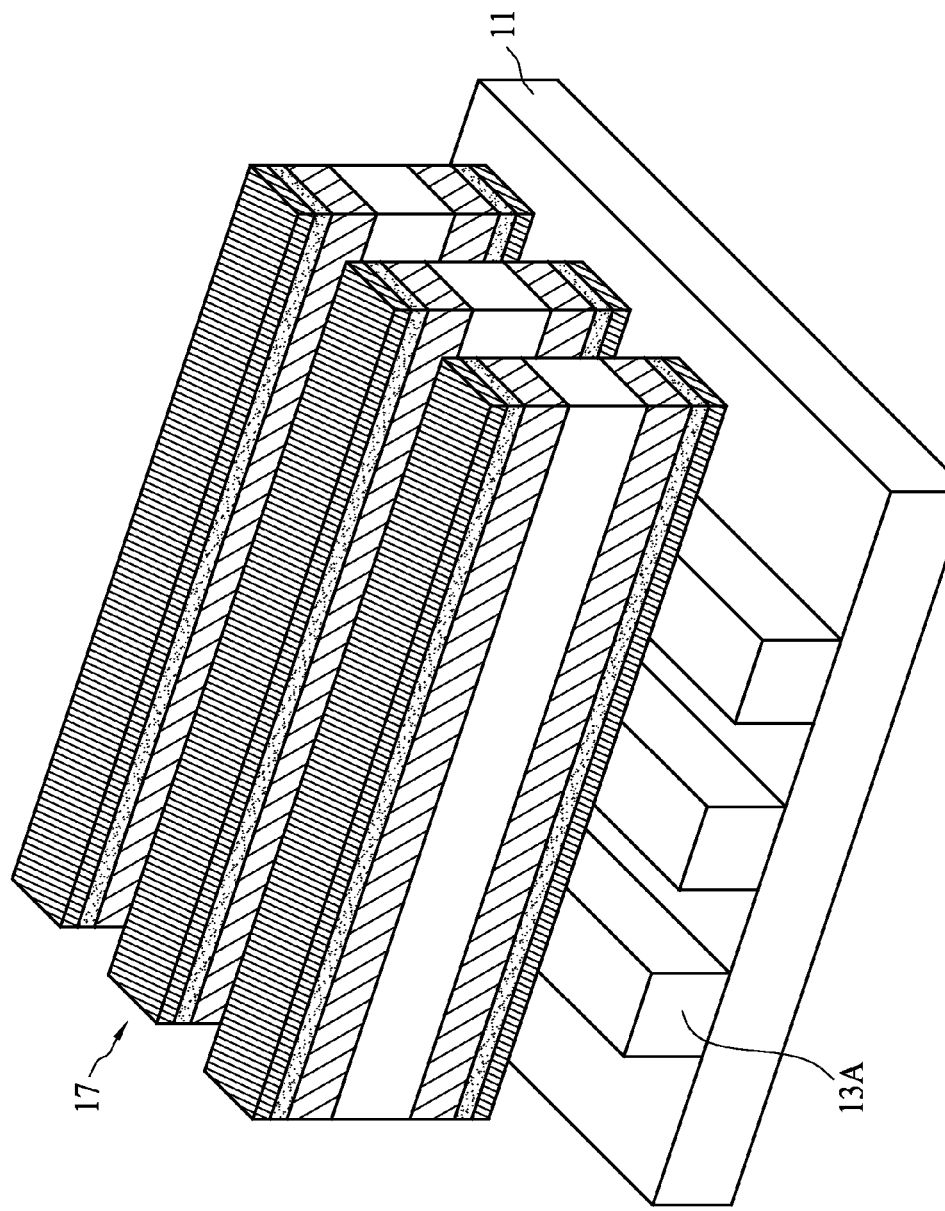
Figure 8:
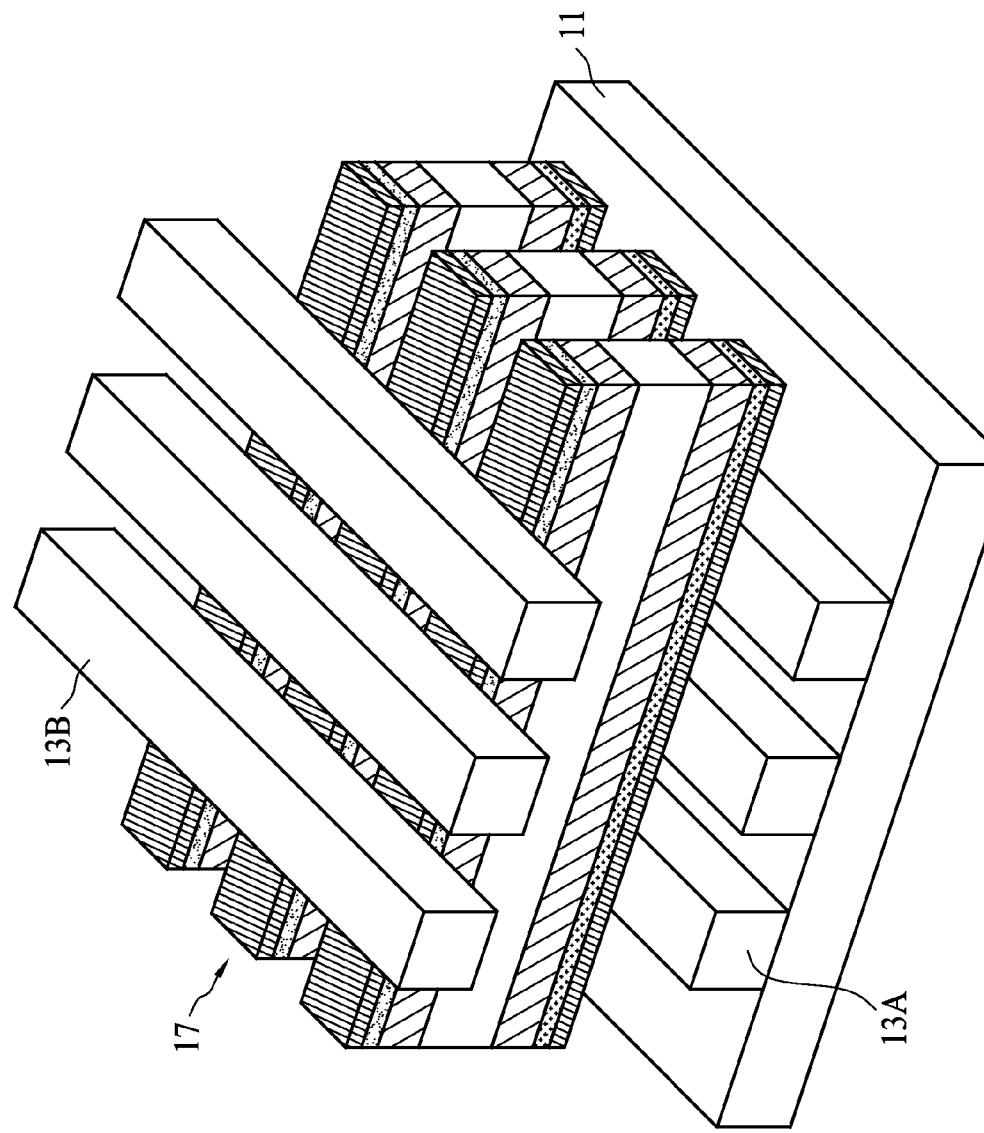

FIG. 6 to FIG. 8 illustrate a method for preparing the NAND flash memory structure 10A according to one embodiment of the present disclosure. For clearance purposes, the isolation material is omitted in FIG. 6 to FIG. 8. Referring to FIG. 6, in one embodiment of the present invention, fabrication processes including deposition, lithographic and etching processes are performed on a substrate 11 to form the first bitline 13A. Referring to FIG. 7, in one embodiment of the present invention, fabrication processes including deposition, lithographic and etching processes are performed on the first bitline 13A to form the separated lines 17. Referring to FIG. 8, in one embodiment of the present invention, fabrication processes including deposition, lithographic and etching processes are performed on the separated lines 17 to form the second bitlines 13B. In one embodiment of the present invention, the substrate 11 can be an insulating substrate or a plate with an insulating layer thereon, wherein the plate can comprise ceramics, silicon, metal, or glass such as quartz.

Figure 9:
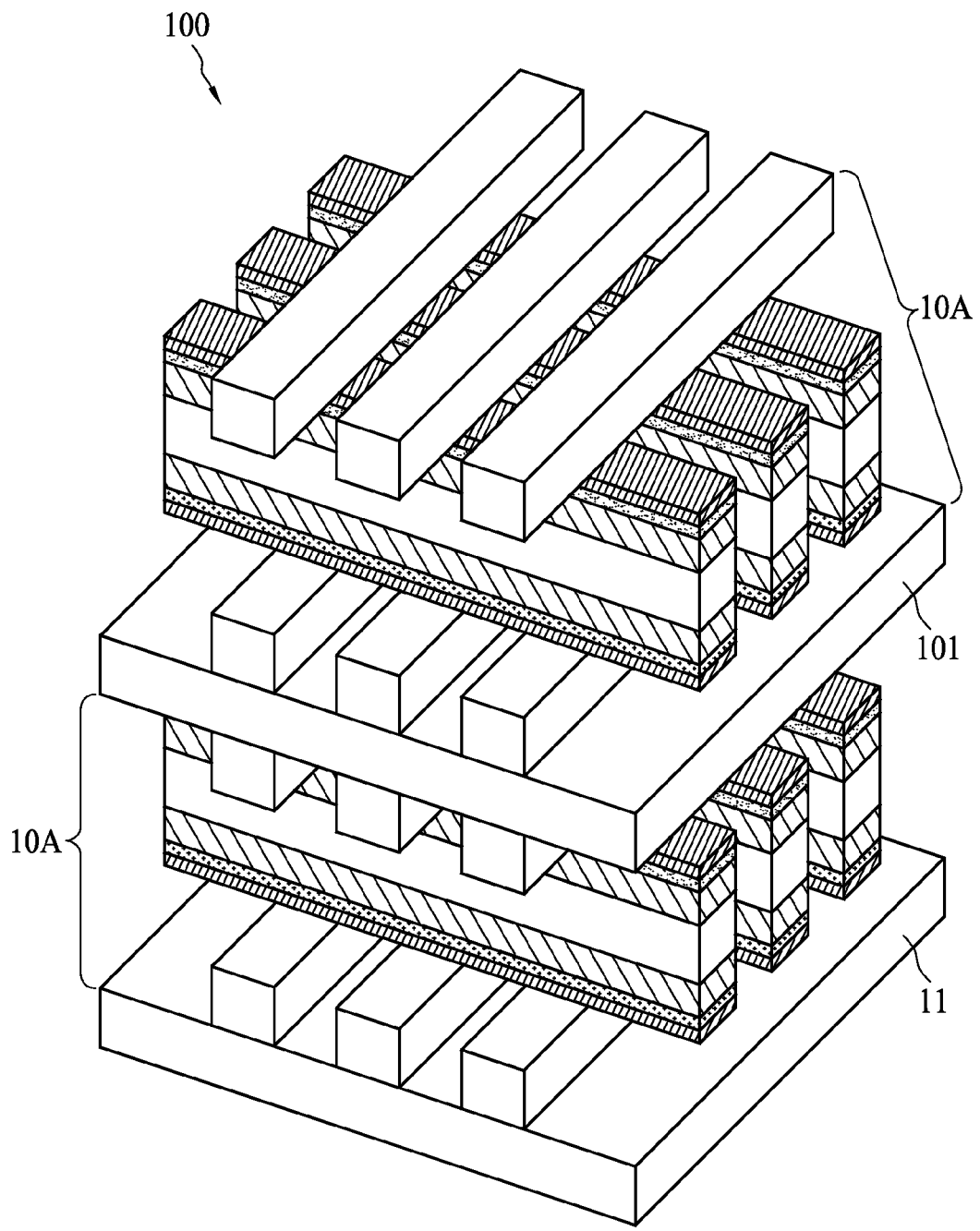
FIG. 9 illustrates a method for preparing a NAND flash memory according to one embodiment of the present disclosure.

FIG. 9 illustrates a method for preparing a NAND flash memory 100 according to one embodiment of the present disclosure. For clearance purposes, the isolation material is omitted in FIG. 9. In one embodiment of the present invention, the fabrication processes shown in FIG. 6 to FIG. 8 are performed to form a first NAND flash memory structure 10A on a substrate 11, and a deposition process is performed to form an insulating layer 101 covering the first NAND flash memory structure 10A. Subsequently, the fabrication processes shown in FIG. 6 to FIG. 8 are repeated to form a second NAND flash memory structure 10A on the insulating layer 101 so as to form the NAND flash memory 100 with the NAND flash memory structures 10A stacked along the third direction. In one embodiment of the present invention, the deposition process to form the insulating layer 101 and the fabrication processes shown in FIG. 6 to FIG. 8 can be further repeated to have more NAND flash memory structures 10A stacked vertically so as to increase the memory capacity of the NAND flash memory 100. In one embodiment of the present invention, the two memory structures 10A are arranged in a symmetrical manner with respect to the insulating layer 101.

Figure 10:
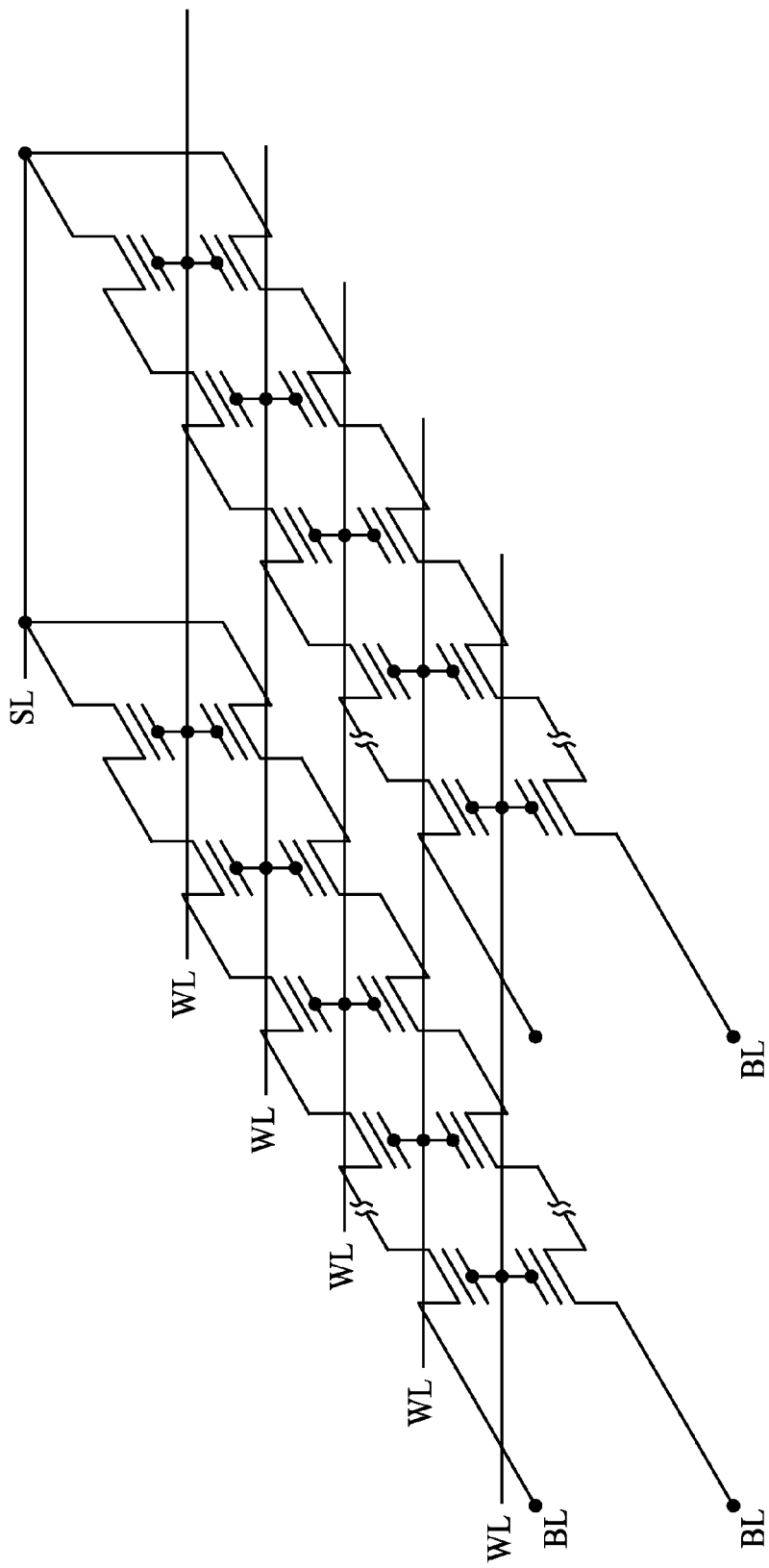
FIG. 10 illustrates an equivalent circuit corresponding to the NAND flash memory structure according to one embodiment of the present disclosure.

FIG. 10 illustrates an equivalent circuit corresponding to the NAND flash memory structure 10A according to one embodiment of the present disclosure. In one embodiment of the present invention, the programming operation of the NAND flash memory structure 10A is performed by grounding the corresponding bitline (BL) and applying a high voltage to the corresponding wordline (WL). In one embodiment of the present invention, the erasing operation of the NAND flash memory structure 10A is performed by grounding the corresponding wordline (WL) and applying a high voltage to the corresponding bitline (BL).

Figure 11:
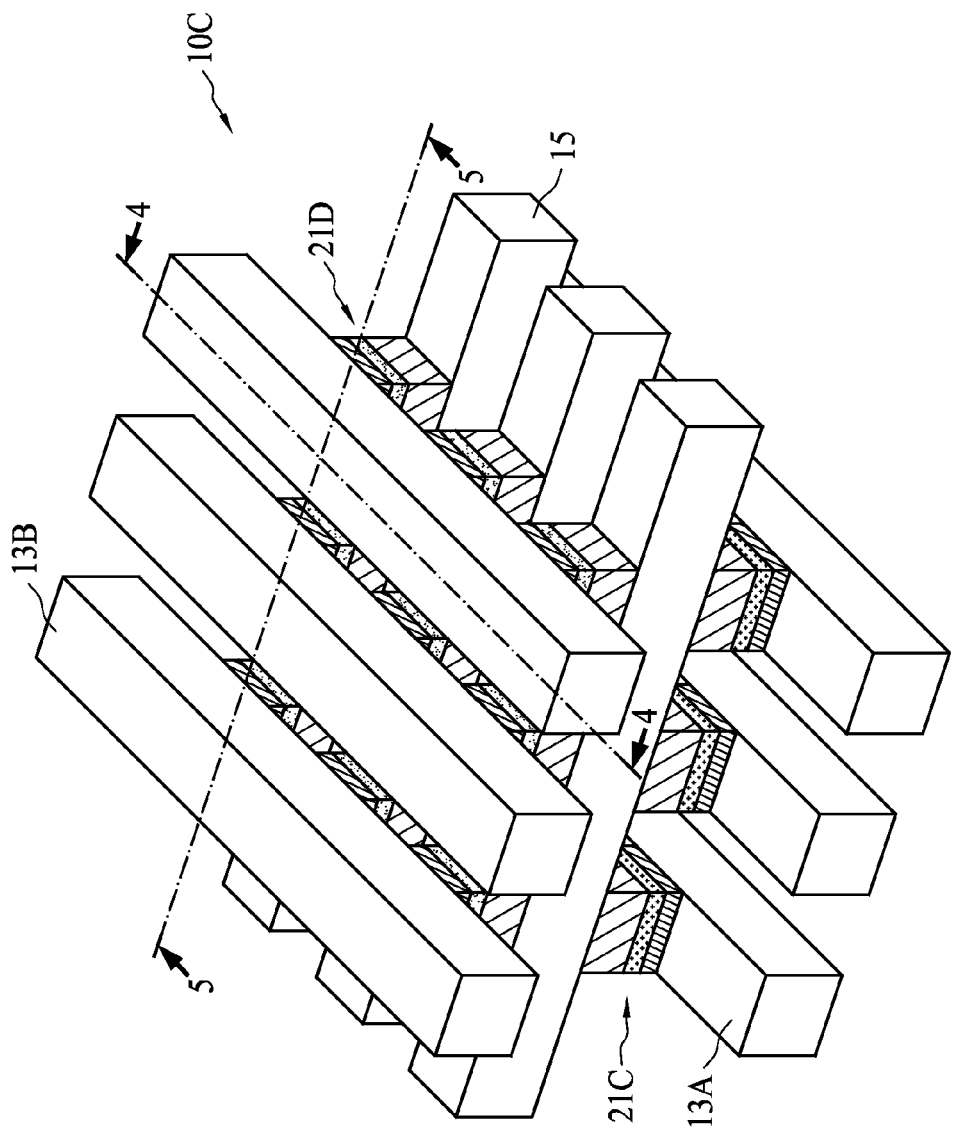
FIG. 11 illustrates a full view of a NAND flash memory structure according to one embodiment of the present disclosure.

FIG. 11 illustrates a full view of a NAND flash memory structure 10C according to one embodiment of the present disclosure. For clearance purposes, the isolation material is omitted in FIG. 11. In one embodiment of the present invention, the NAND flash memory structure 10C comprises a plurality of first bitlines 13A and a plurality of second bitlines 13B extending along a first direction substantially in a horizontal manner, a plurality of first charge-trapping stacks 21C positioned over the first bitlines 13A, a plurality of second charge-trapping stacks 21D positioned below the second bitlines 13B, and a plurality of wordlines 15 positioned between the first charge-trapping stacks 21C and the second charge-trapping stacks 21D, wherein the wordlines 15 extend along a second direction substantially in a horizontal manner. In one embodiment of the present invention, the first charge-trapping stacks 21C are separated from each other, and the second charge-trapping stacks 21D are separated from each other. In one embodiment of the present invention, the first charge-trapping stacks 21C are positioned in an array manner, and the second charge-trapping stacks 21D are positioned in an array manner.

Figure 12:
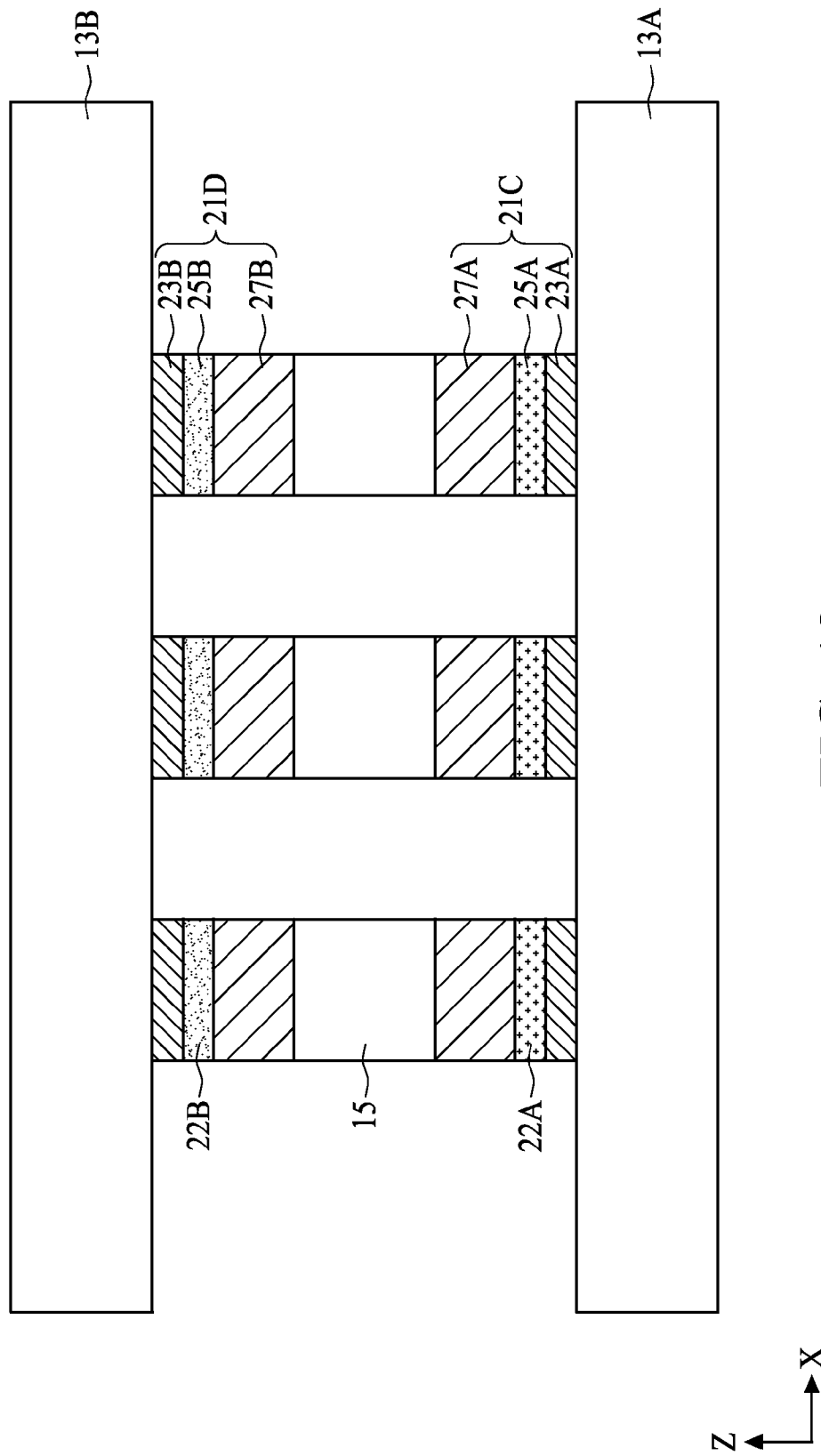
FIG. 12 illustrates a sectional view along line 4-4 in FIG. 11 according to one embodiment of the present disclosure.

FIG. 12 illustrates a sectional view along line 4-4 in FIG. 11 according to one embodiment of the present disclosure. For clearance purposes, the isolation material is omitted in FIG. 12. In one embodiment of the present invention, the first charge-trapping stack 21C and the second charge-trapping stack 21D are arranged in a symmetrical manner with respect to the wordline 15. In one embodiment of the present invention, the first charge-trapping stack 21C comprises a first dielectric layer 23A, a second dielectric layer 27A, and an intervening layer 25A between the first dielectric layer 23A and the second dielectric layer 27A, wherein the intervening layer 25A is a semiconductor layer (silicon layer), a metal layer (tungsten layer), a dielectric layer (nitride layer) or a quantum dot layer. In one embodiment of the present invention, the first dielectric layer 23A and the second dielectric layer 27A are oxide layers, and the intervening layer 25A is a nitride layer. In one embodiment of the present invention, the quantum dot layer is implemented by a first material serving as a matrix and a second material serving as dots embedded in the matrix, wherein the energy gap of the first material is greater than that of the second material. In one embodiment of the present invention, the thickness of the first dielectric layer 23A is less than that of the second dielectric layer 27A.

In one embodiment of the present invention, the second charge-trapping stack 21D comprises a first dielectric layer 23B, a second dielectric layer 27B, and an intervening layer 25B between the first dielectric layer 23B and the second dielectric layer 27B, wherein the intervening layer 25B is a semiconductor layer (silicon layer), a metal layer (tungsten layer), a dielectric layer (nitride layer) or a quantum dot layer. In one embodiment of the present invention, the first dielectric layer 23A and the second dielectric layer 27A are oxide layers, and the intervening layer 25A is a nitride layer. In one embodiment of the present invention, the quantum dot layer is implemented by a first material serving as a matrix and a second material serving as dots embedded in the matrix, wherein the energy gap of the first material is greater than that of the second material. In one embodiment of the present invention, the thickness of the first dielectric layer 23B is less than that of the second dielectric layer 27B.

Figure 13:
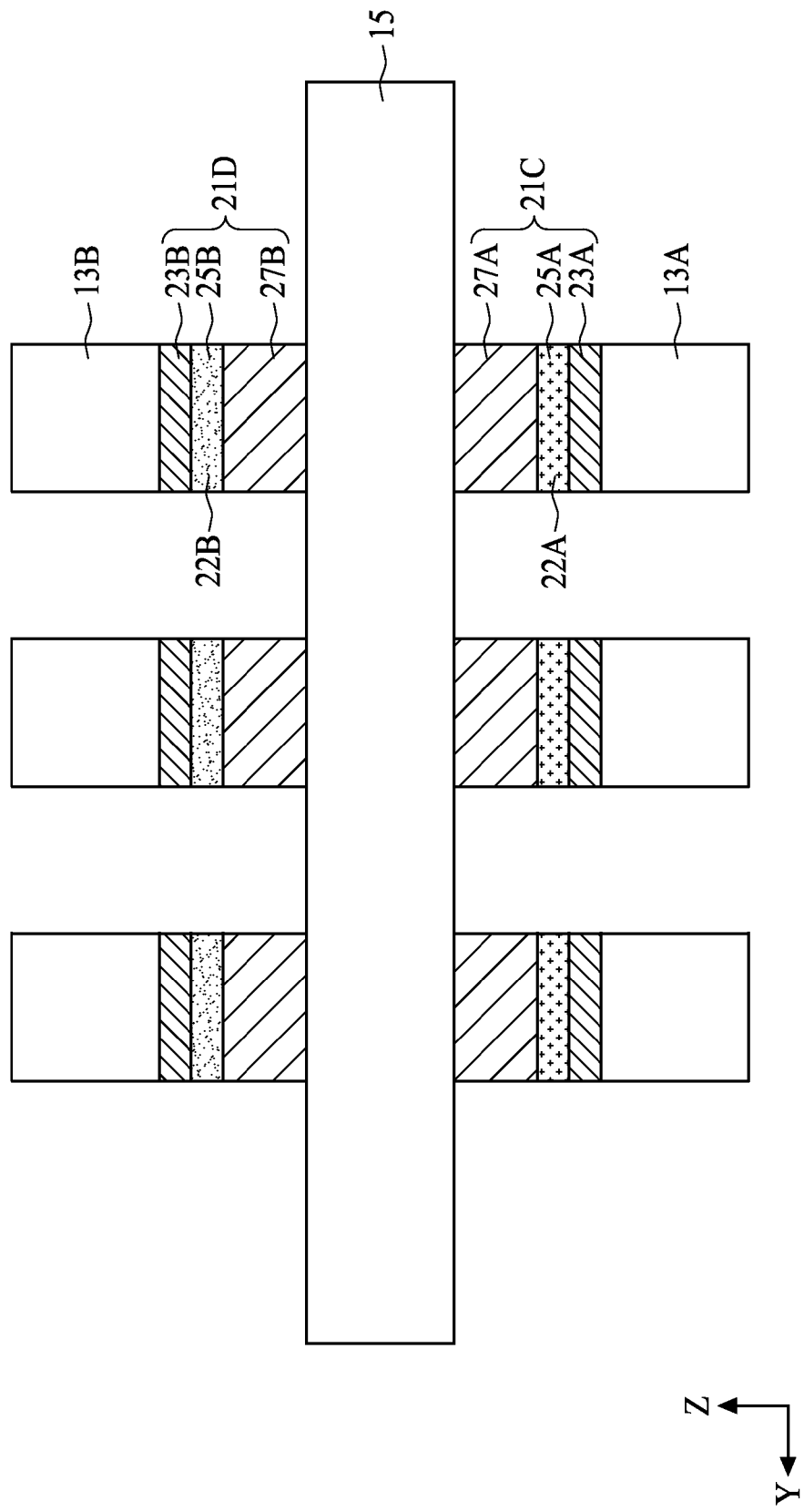
FIG. 13 illustrates a sectional view along line 5-5 in FIG. 11 according to one embodiment of the present disclosure.

FIG. 13 illustrates a sectional view along line 5-5 in FIG. 11 according to one embodiment of the present disclosure. For clearance purposes, the isolation material is omitted in FIG. 13. In one embodiment of the present invention, the first charge-trapping stack 21C comprises a first charge-trapping region 22A between the wordline 15 and one of the first bitlines 13A. In one embodiment of the present invention, the second charge-trapping stack 21D comprises a second charge-trapping region 22B between the wordline 15 and one of the second bitlines 13B.

In one embodiment of the present invention, the first charge-trapping region 22A and the second charge-trapping region 22B are stacked along the third direction, which is substantially perpendicular to the first direction, as shown in FIG. 12. In one embodiment of the present invention, the first charge-trapping region 22A and the second charge-trapping region 22B are stacked along the third direction, which is substantially perpendicular to the second direction, as shown in FIG. 13.

Referring to FIG. 13, in one embodiment of the present invention, the first bitline 13A and the second bitline 13B are aligned vertically, i.e., aligned along the third direction. Similarly, in one embodiment of the present invention, the first charge-trapping region 22A and the second charge-trapping region 22B are aligned vertically, i.e., aligned along the third direction. In one embodiment of the present invention, the space between the first bitlines 13A is between 20 nm and 25 nm. In one embodiment of the present invention, the memory structure 10C comprises a first carrier channel positioned substantially in a horizontal manner in the first bitline 13A close to the first charge-trapping stack 21C, and a second carrier channel positioned substantially in a horizontal manner in the second bitline 13B close to the second charge-trapping stack 21D.

Figure 14:
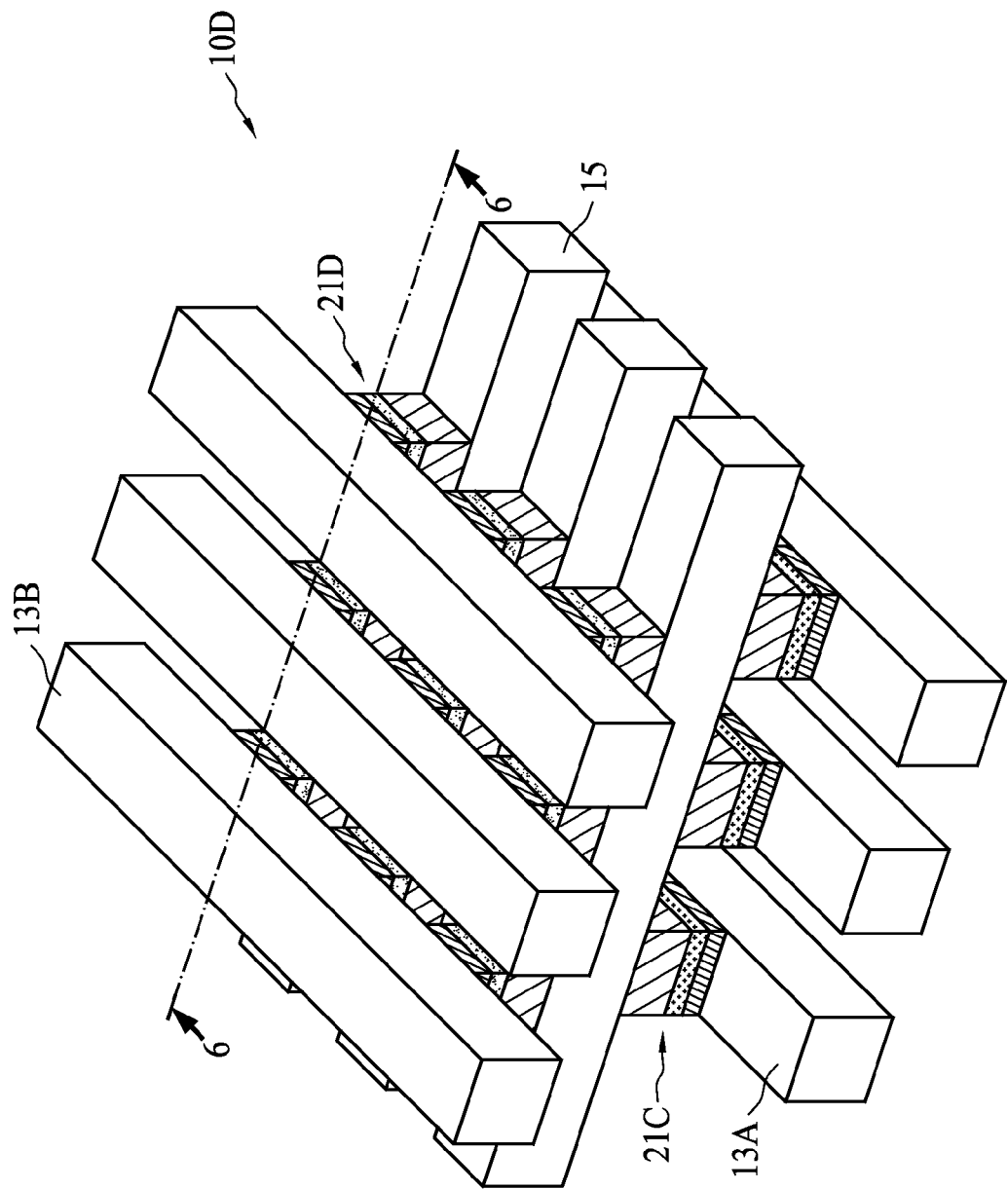
FIG. 14 illustrates a full view of a NAND flash memory structure according to one embodiment of the present disclosure.
Figure 15:
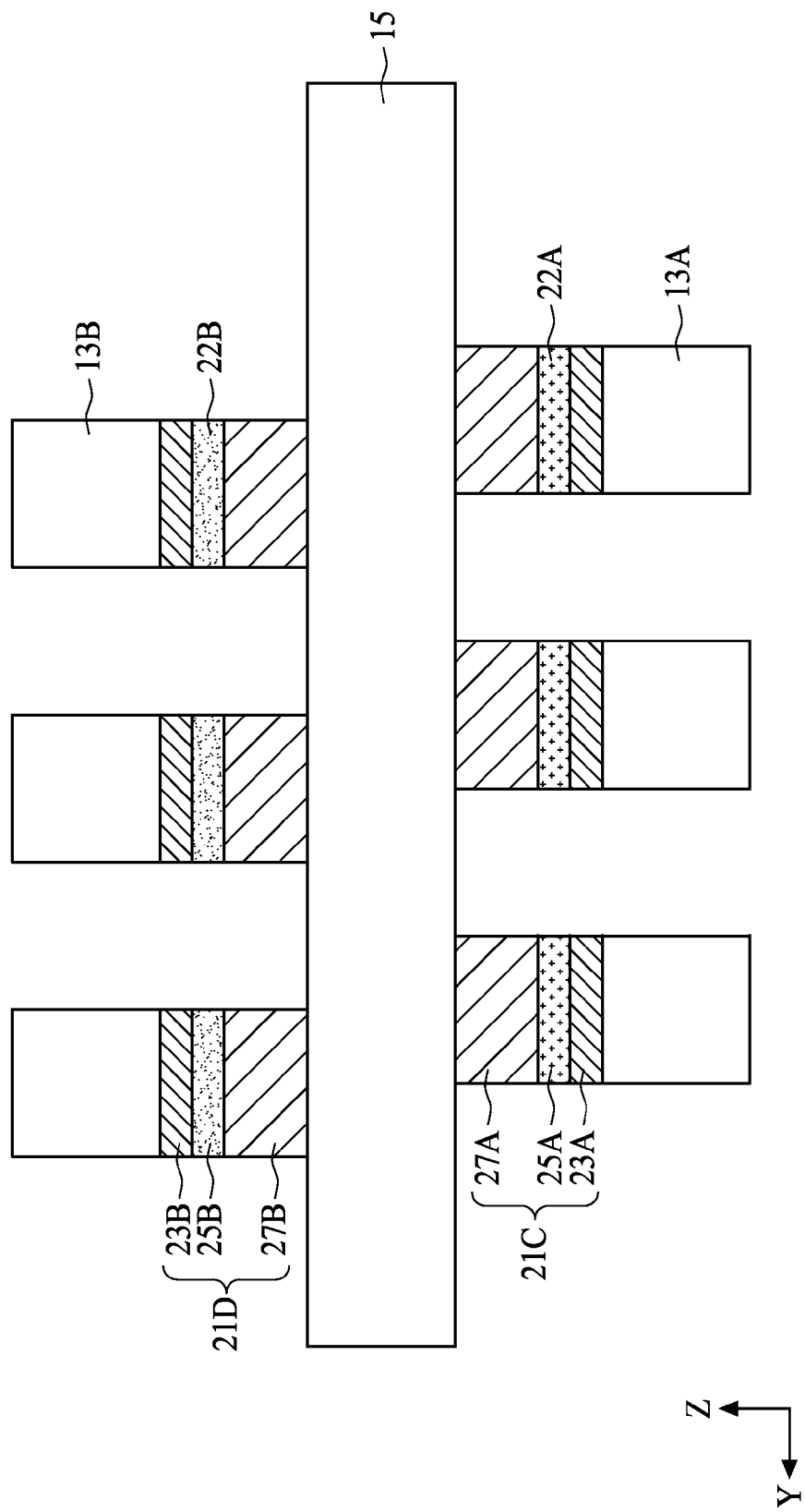
FIG. 15 illustrates a sectional view along line 6-6 in FIG. 14 according to one embodiment of the present disclosure.

FIG. 14 illustrates a full view of a NAND flash memory structure 10D according to one embodiment of the present disclosure, and FIG. 15 illustrates a sectional view along line 6-6 in FIG. 14 according to one embodiment of the present disclosure. For clearance purposes, the isolation material is omitted in FIG. 14 and FIG. 15. In FIG. 13, the first bitline 13A and the second bitline 13B are aligned vertically; in contrast, in FIG. 14 the first bitline 13A and the second bitline 13B are positioned in a staggered manner along the third direction. Furthermore, in FIG. 13, the first charge-trapping region 22A and the second charge-trapping region 22B are aligned vertically; in contrast, in FIG. 14 the first charge-trapping region 22A and the second charge-trapping region 22B are positioned in a staggered manner along the third direction.

Figure 16:
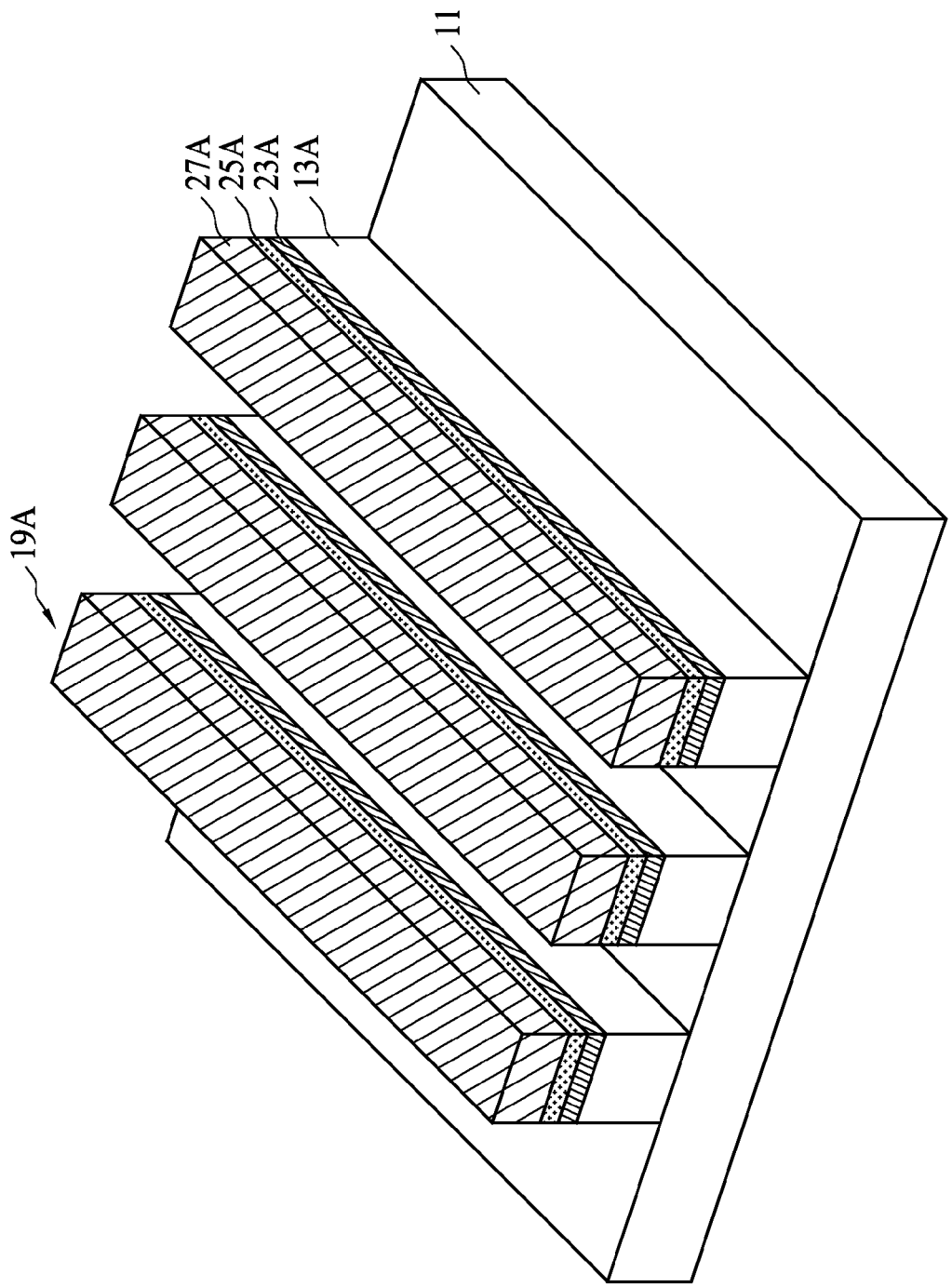
FIG. 16 to FIG. 18 illustrate a method for preparing the NAND flash memory structure according to one embodiment of the present disclosure.
Figure 17:
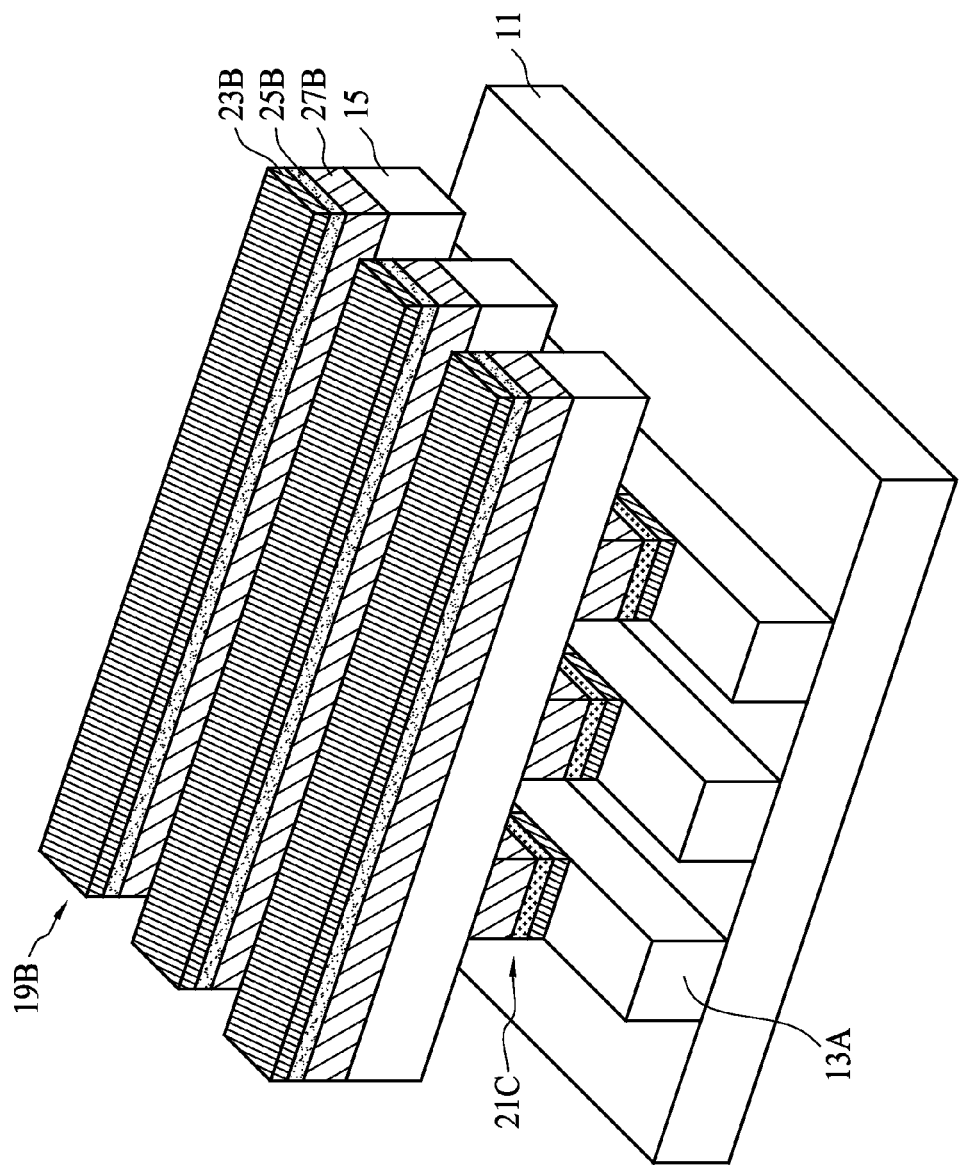
Figure 18:
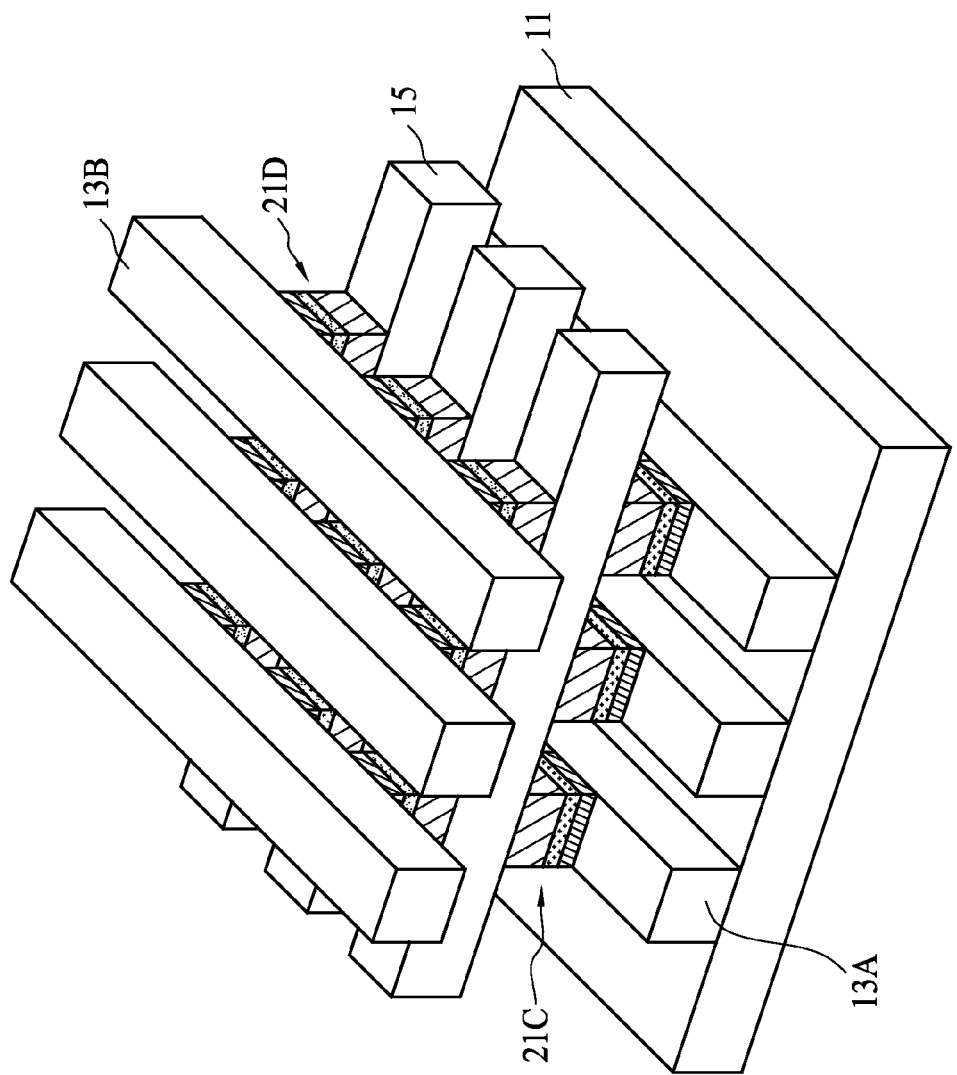

FIG. 16 to FIG. 18 illustrate a method for preparing the NAND flash memory structure 10C according to one embodiment of the present disclosure. For clearance purposes, the isolation material is omitted in FIG. 16 to FIG. 18. Referring to FIG. 16, in one embodiment of the present invention, fabrication processes including deposition, lithographic and etching processes are performed on a substrate 11 to form the first bitlines 13A with first separated lines 19A thereon, wherein the first separated line 19A includes the first dielectric layer 23A, the intervening layer 25A and the second dielectric layer 27A. Referring to FIG. 17, in one embodiment of the present invention, fabrication processes including deposition, lithographic and etching processes are performed on the first bitline 13A to form the wordlines 15 with second separated lines 19B thereon, wherein the etching process removes a portion of the first separated line 19A not under the second separated lines 19B to form the first charge-trapping stack 21C. Referring to FIG. 18, in one embodiment of the present invention, fabrication processes including deposition, lithographic and etching processes are performed on the second separated lines 19B to form the second bitlines 13B, wherein the etching process removes a portion of the second separated line 19B not under the second bitlines 13B to form the second charge-trapping stack 21D. In one embodiment of the present invention, the substrate 11 can be an insulating substrate or a plate with an insulating layer thereon, wherein the plate can comprise ceramics, silicon, metal, or glass such as quartz.

Figure 19:
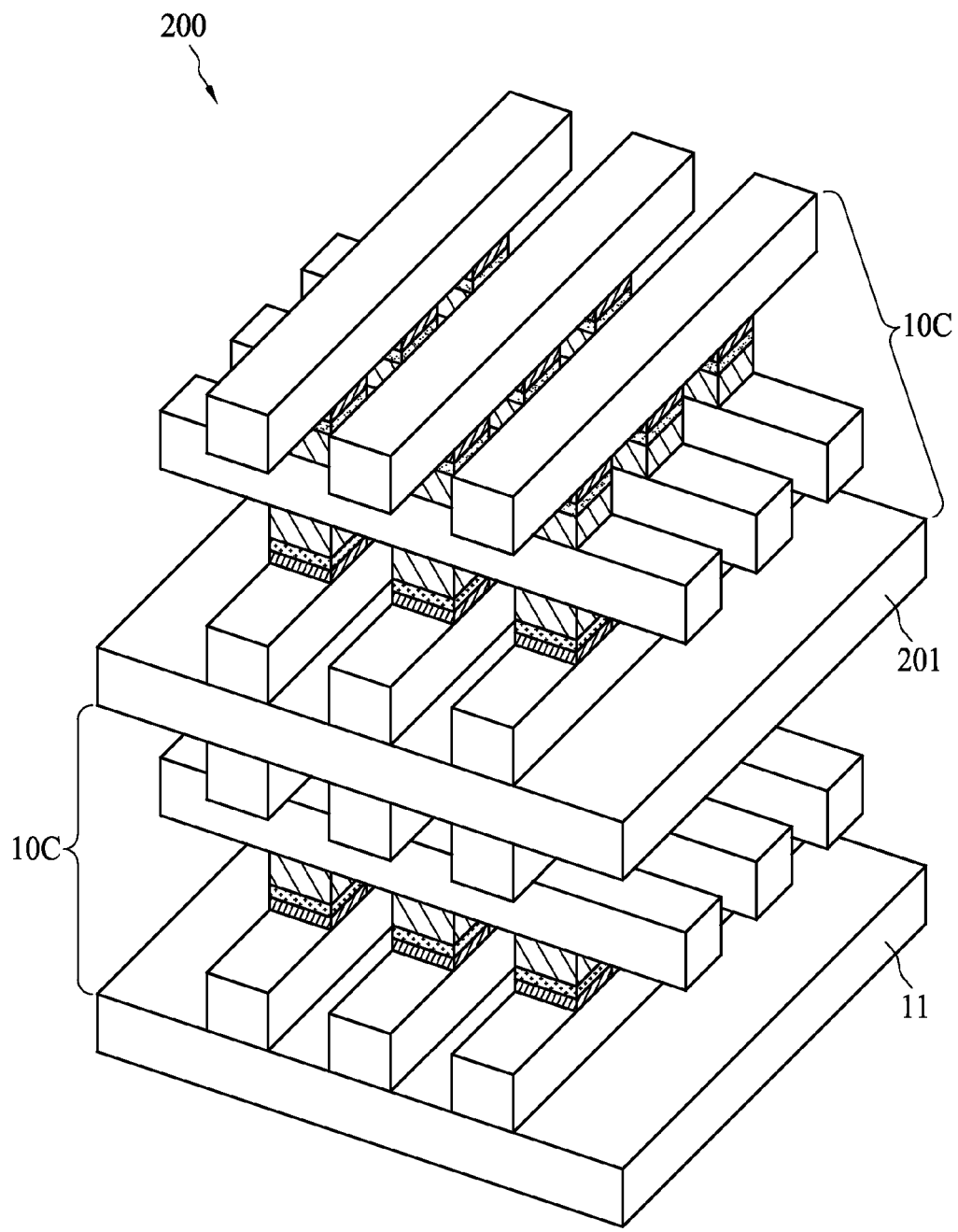
FIG. 19 illustrates a method for preparing a NAND flash memory according to one embodiment of the present disclosure.

FIG. 19 illustrates a method for preparing a NAND flash memory 200 according to one embodiment of the present disclosure. For clearance purposes, the isolation material is omitted in FIG. 19. In one embodiment of the present invention, the fabrication processes shown in FIG. 16 to FIG. 18 are performed to form a first NAND flash memory structure 10C on a substrate 11, and a deposition process is performed to form an insulating layer 201 covering the first NAND flash memory structure 10C. Subsequently, the fabrication processes shown in FIG. 16 to FIG. 18 are repeated to form a second NAND flash memory structure 10C on the insulating layer 201 so as to form the NAND flash memory 200 with the NAND flash memory structures 10C stacked along the third direction. In one embodiment of the present invention, the deposition process to form the insulating layer 201 and the fabrication processes shown in FIG. 16 to FIG. 18 can be further repeated to have more NAND flash memory structures 10C stacked vertically so as to increase the memory capacity of the NAND flash memory 200. In one embodiment of the present invention, the two memory structures 10C are arranged in a symmetrical manner with respect to the insulating layer 201.

Figure 20:
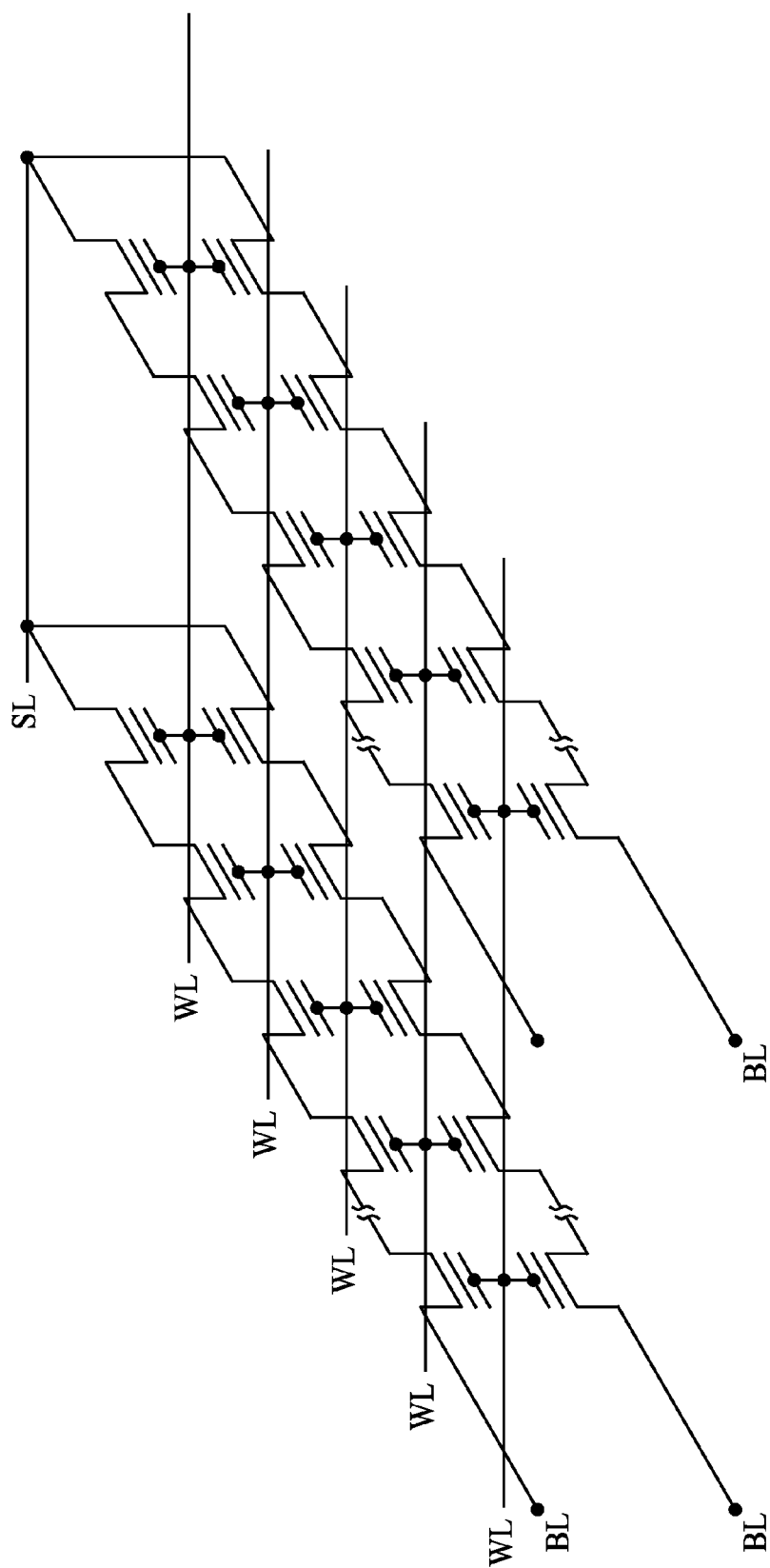
FIG. 20 illustrates an equivalent circuit corresponding to the NAND flash memory structure according to one embodiment of the present disclosure.

FIG. 20 illustrates an equivalent circuit corresponding to the NAND flash memory structure 10C according to one embodiment of the present disclosure. In one embodiment of the present invention, the programming operation of the NAND flash memory structure 10C is performed by grounding the corresponding bitline (BL) and applying a high voltage to the corresponding wordline (WL). In one embodiment of the present invention, the erasing operation of the NAND flash memory structure 10C is performed by grounding the corresponding wordline (WL) and applying a high voltage to the corresponding bitline (BL).

Figure 21:
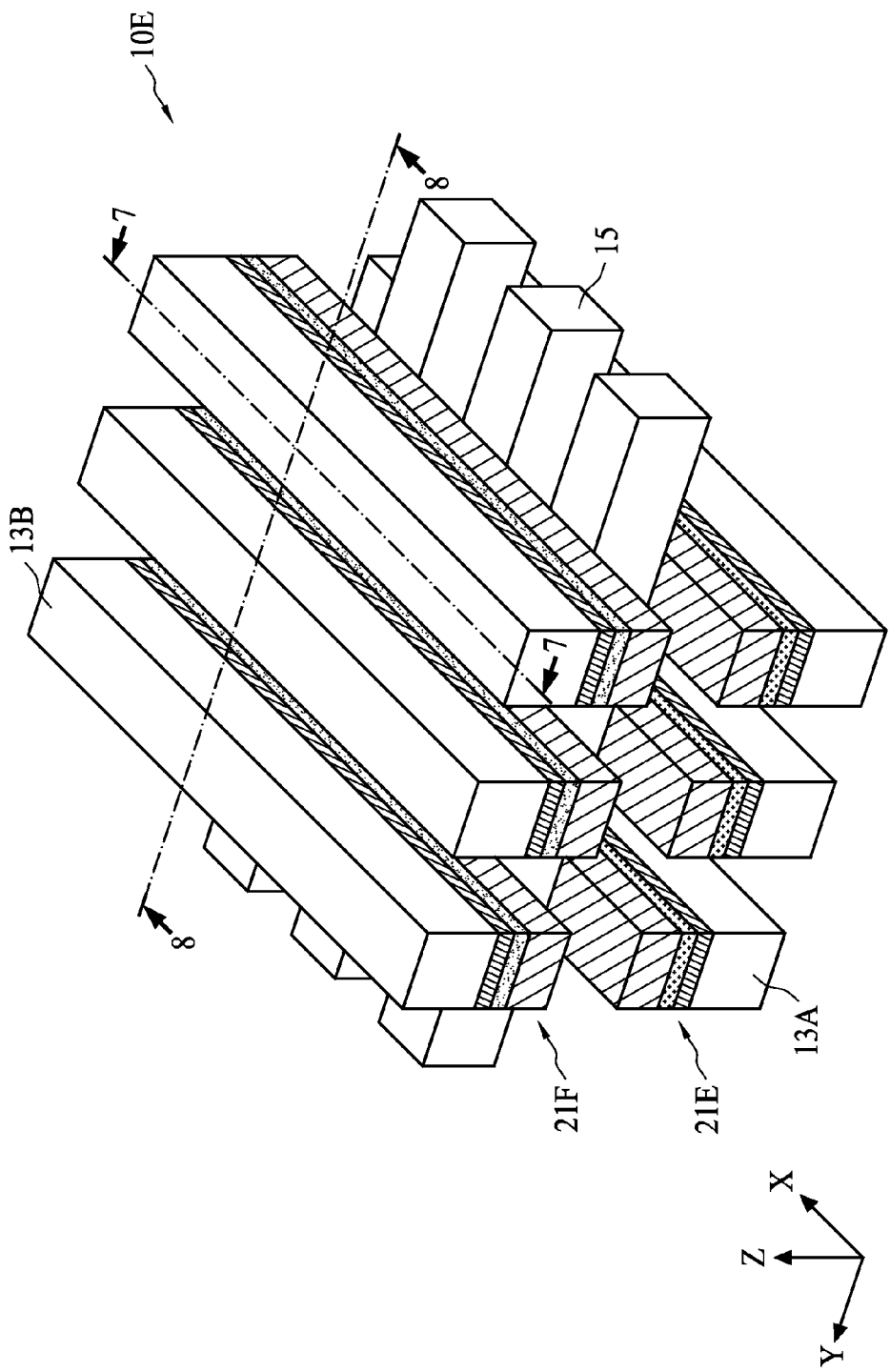
FIG. 21 illustrates a full view of a NAND flash memory structure according to one embodiment of the present disclosure.

FIG. 21 illustrates a full view of a NAND flash memory structure 10E according to one embodiment of the present disclosure. For clearance purposes, the isolation material is omitted in FIG. 21. In one embodiment of the present invention, the NAND flash memory structure 10E comprises a plurality of first bitlines 13A, a plurality of second bitlines 13B, a plurality of first charge-trapping stacks 21E over the first bitlines 13A, a plurality of second charge-trapping stacks 21F over the second bitlines 13B, and a plurality of wordlines 15 between the first charge-trapping stack 21E and the second charge-trapping stacks 21F. In one embodiment of the present invention, the first bitlines 13A and the second bitlines 13B extend along a first direction substantially in a horizontal manner, and the wordlines 15 extend along a second direction substantially in a horizontal manner.

Figure 22:
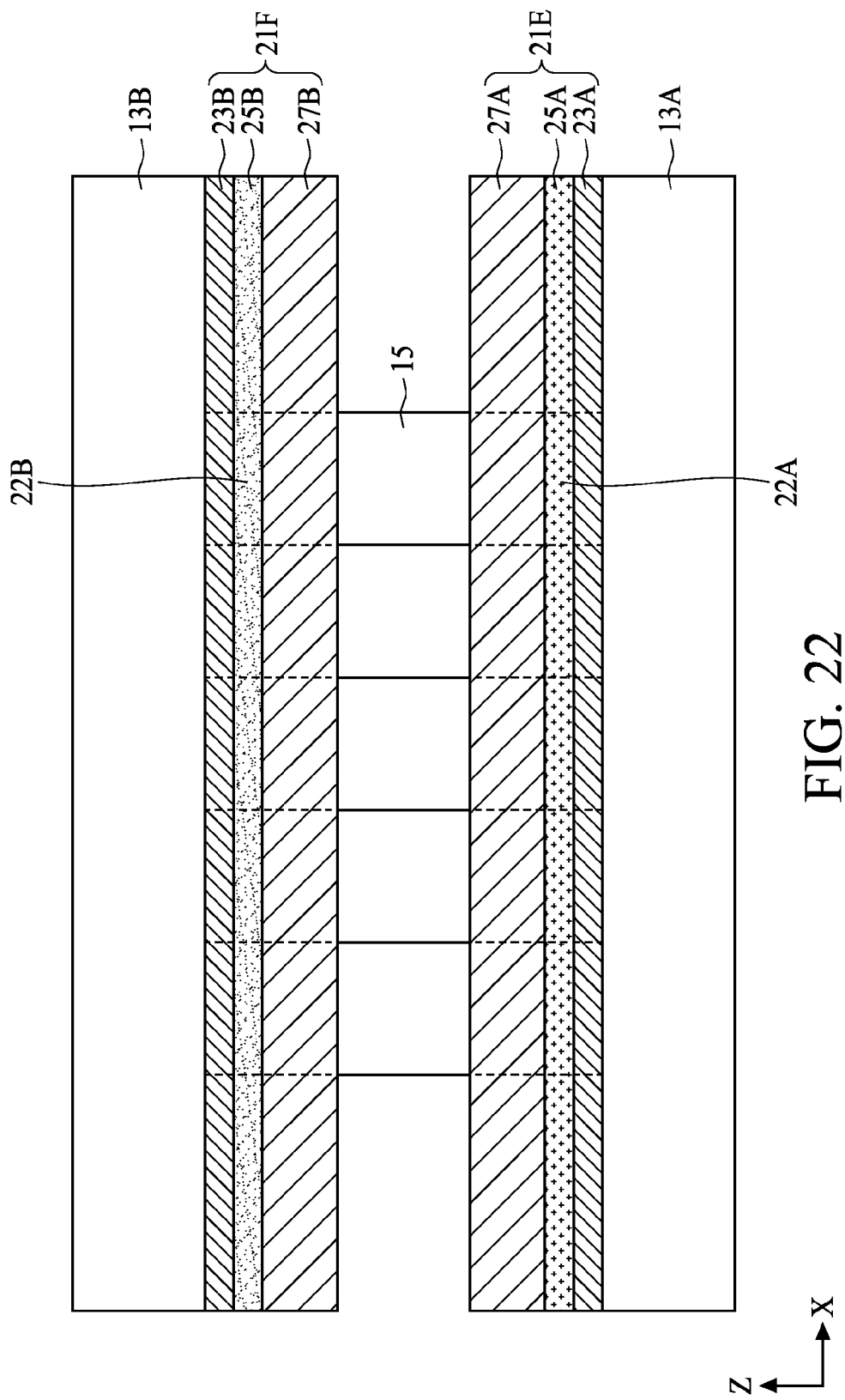
FIG. 22 illustrates a sectional view along line 7-7 in FIG. 21 according to one embodiment of the present disclosure.
Figure 23:
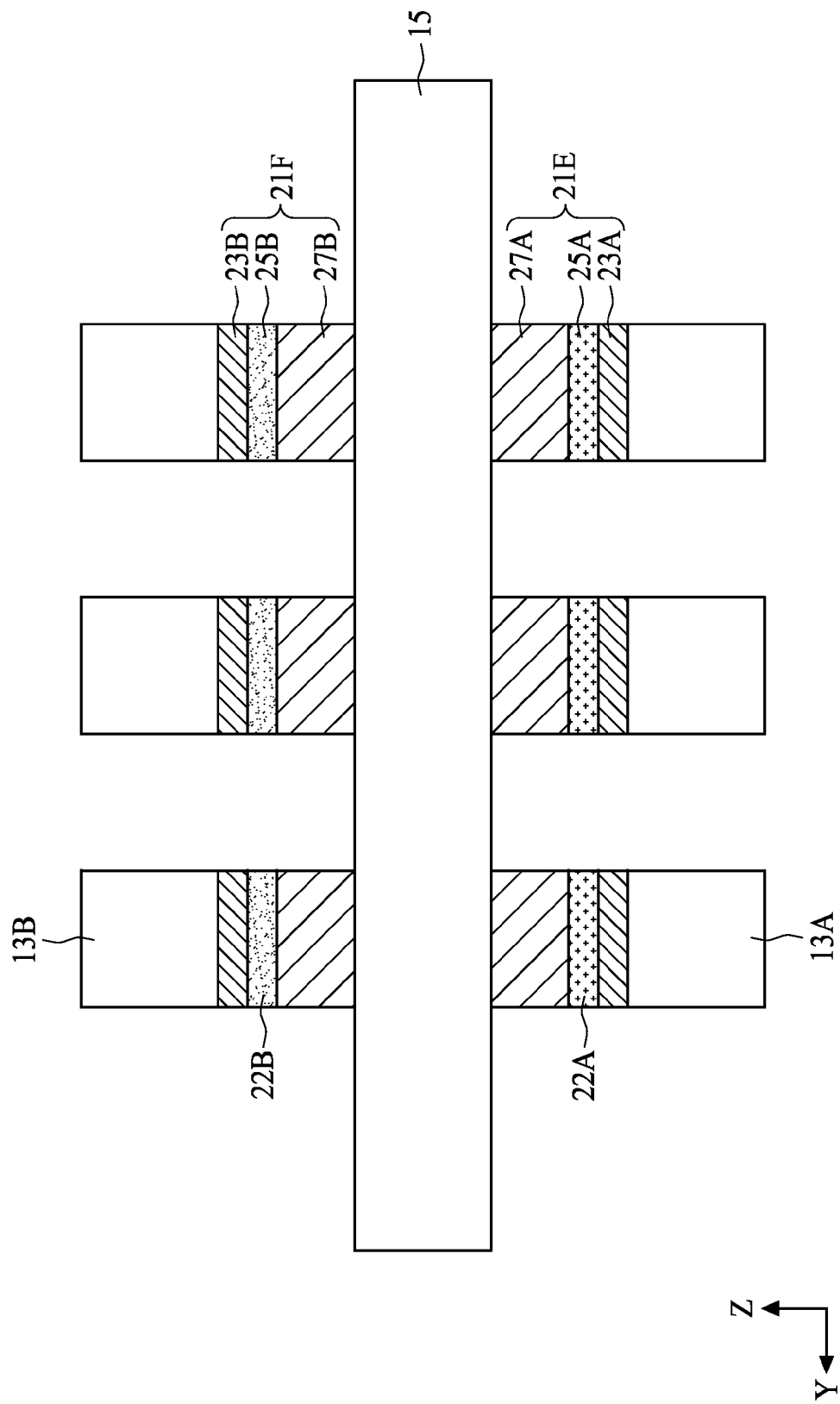
FIG. 23 illustrates a sectional view along line 8-8 in FIG. 21 according to one embodiment of the present disclosure.

FIG. 22 illustrates a sectional view along line 7-7 in FIG. 21 according to one embodiment of the present disclosure, and FIG. 23 illustrates a sectional view along line 8-8 in FIG. 21 according to one embodiment of the present disclosure. For clearance purposes, the isolation material is omitted in FIG. 22 and FIG. 23. In one embodiment of the present invention, the first charge-trapping stack 21E and the second charge-trapping stack 21F are arranged in a symmetrical manner with respect to the wordline 15. In one embodiment of the present invention, the first charge-trapping stack 21E comprises a first dielectric layer 23A, a second dielectric layer 27A, and an intervening layer 25A between the first dielectric layer 23A and the second dielectric layer 27A, wherein the intervening layer 25A is a dielectric layer or a quantum dot layer. In one embodiment of the present invention, the first charge-trapping stack 21E comprises a plurality of first charge-trapping regions 22A between the wordline 15 and one of the first bitlines 13A.

In one embodiment of the present invention, the first dielectric layer 23A and the second dielectric layer 27A are oxide layers, and the intervening layer 25A is a nitride layer. In one embodiment of the present invention, the quantum dot layer is implemented by a first material serving as a matrix and a second material serving as dots embedded in the matrix, wherein the energy gap of the first material is greater than that of the second material. In one embodiment of the present invention, the thickness of the first dielectric layer 23A is less than that of the second dielectric layer 27A.

In one embodiment of the present invention, the second charge-trapping stack 21F comprises a first dielectric layer 23B, a second dielectric layer 27B, and an intervening layer 25B between the first dielectric layer 23B and the second dielectric layer 27B, wherein the intervening layer 25B is a dielectric layer or a quantum dot layer. In one embodiment of the present invention, the second charge-trapping stack 21F comprises a plurality of second charge-trapping regions 22B between the wordline 15 and one of the second bitlines 13B.

In one embodiment of the present invention, the first dielectric layer 23B and the second dielectric layer 27B are oxide layers, and the intervening layer 25B is a nitride layer. In one embodiment of the present invention, the quantum dot layer is implemented by a first material serving as a matrix and a second material serving as dots embedded in the matrix, wherein the energy gap of the first material is greater than that of the second material. In one embodiment of the present invention, the thickness of the first dielectric layer 23B is less than that of the second dielectric layer 27B.

In one embodiment of the present invention, the first charge-trapping region 22A and the second charge-trapping region 22B are stacked along a third direction, which is substantially perpendicular to the first direction, as shown in FIG. 22. In one embodiment of the present invention, the first charge-trapping region 22A and the second charge-trapping region 22B are stacked along the third direction, which is substantially perpendicular to the second direction, as shown in FIG. 23.

Referring to FIG. 23, in one embodiment of the present invention, the first bitline 13A and the second bitline 13B are aligned vertically, i.e., aligned along the third direction. Similarly, in one embodiment of the present invention, the first charge-trapping region 22A and the second charge-trapping region 22B are aligned vertically, i.e., aligned along the third direction. In one embodiment of the present invention, the space between the first bitlines 13A is between 20 nm and 25 nm. In one embodiment of the present invention, the memory structure 10E comprises a first carrier channel positioned substantially in a horizontal manner in the first bitline 13A close to the first charge-trapping stack 21E, and a second carrier channel positioned substantially in a horizontal manner in the second bitline 13B close to the second charge-trapping stack 21F.

Figure 24:
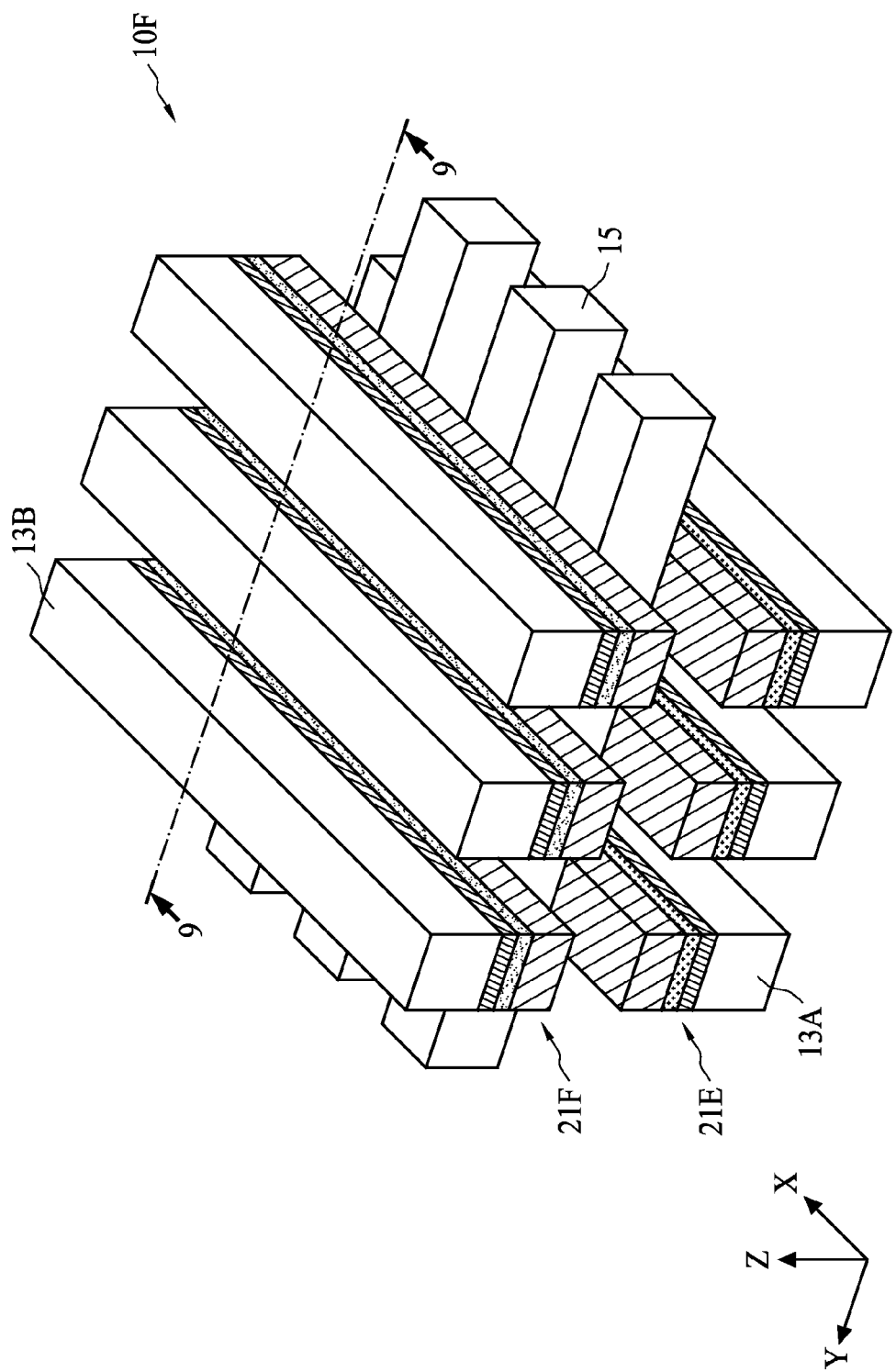
FIG. 24 illustrates a full view of a NAND flash memory structure according to one embodiment of the present disclosure.
Figure 25:
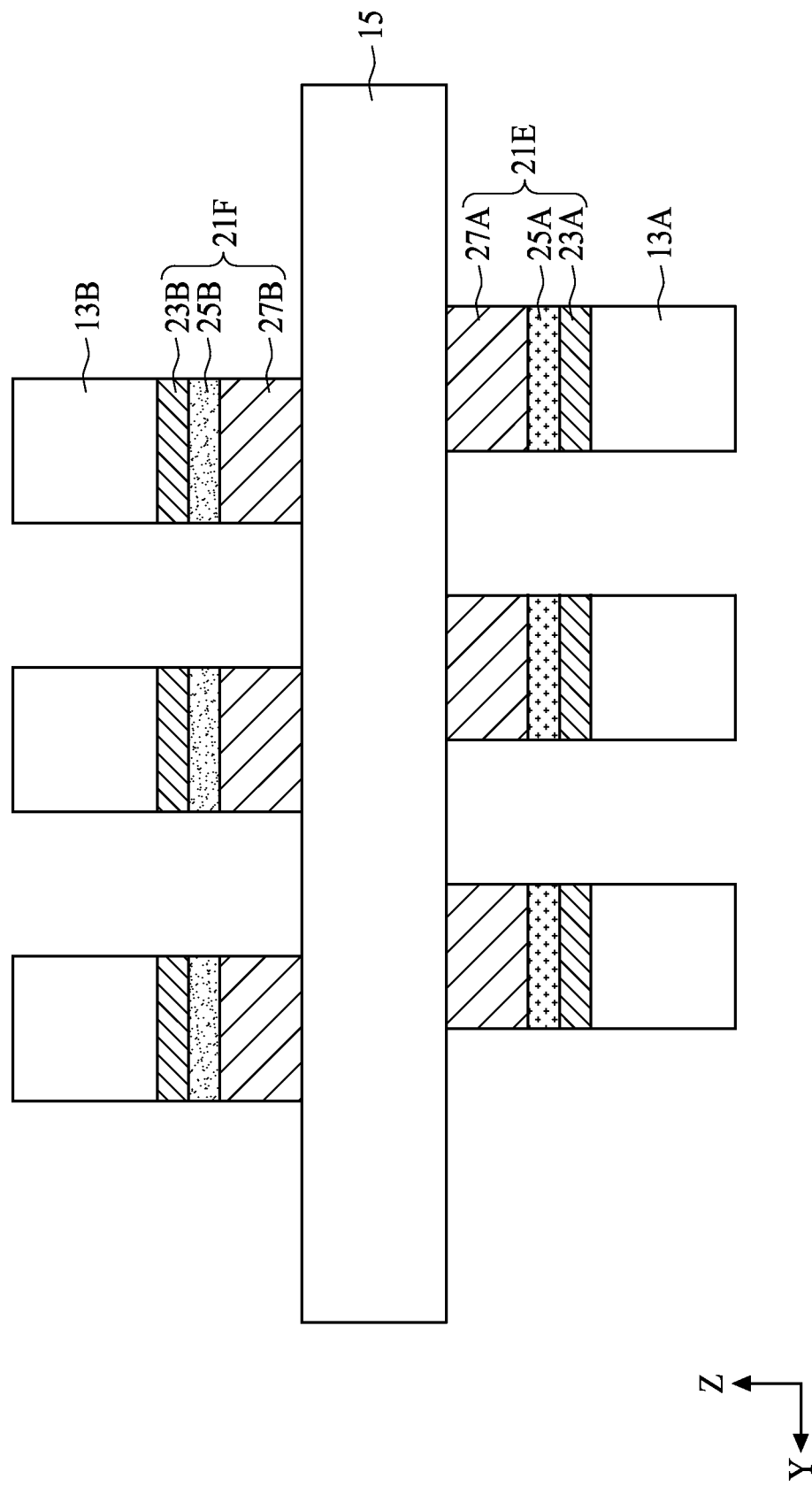
FIG. 25 illustrates a sectional view along line 9-9 in FIG. 24 according to one embodiment of the present disclosure.

FIG. 24 illustrates a full view of a NAND flash memory structure 10F according to one embodiment of the present disclosure, and FIG. 25 illustrates a sectional view along line 9-9 in FIG. 24 according to one embodiment of the present disclosure. For clearance purposes, the isolation material is omitted in FIG. 24 and FIG. 25. In FIG. 23, the first bitline 13A and the second bitline 13B are aligned vertically; in contrast, in FIG. 24 the first bitline 13A and the second bitline 13B are positioned in a staggered manner along the third direction. Furthermore, in FIG. 23, the first charge-trapping region 22A and the second charge-trapping region 22B are aligned vertically, whereas in FIG. 24 the first charge-trapping region 22A and the second charge-trapping region 22B are positioned in a staggered manner along the third direction.

Figure 26:
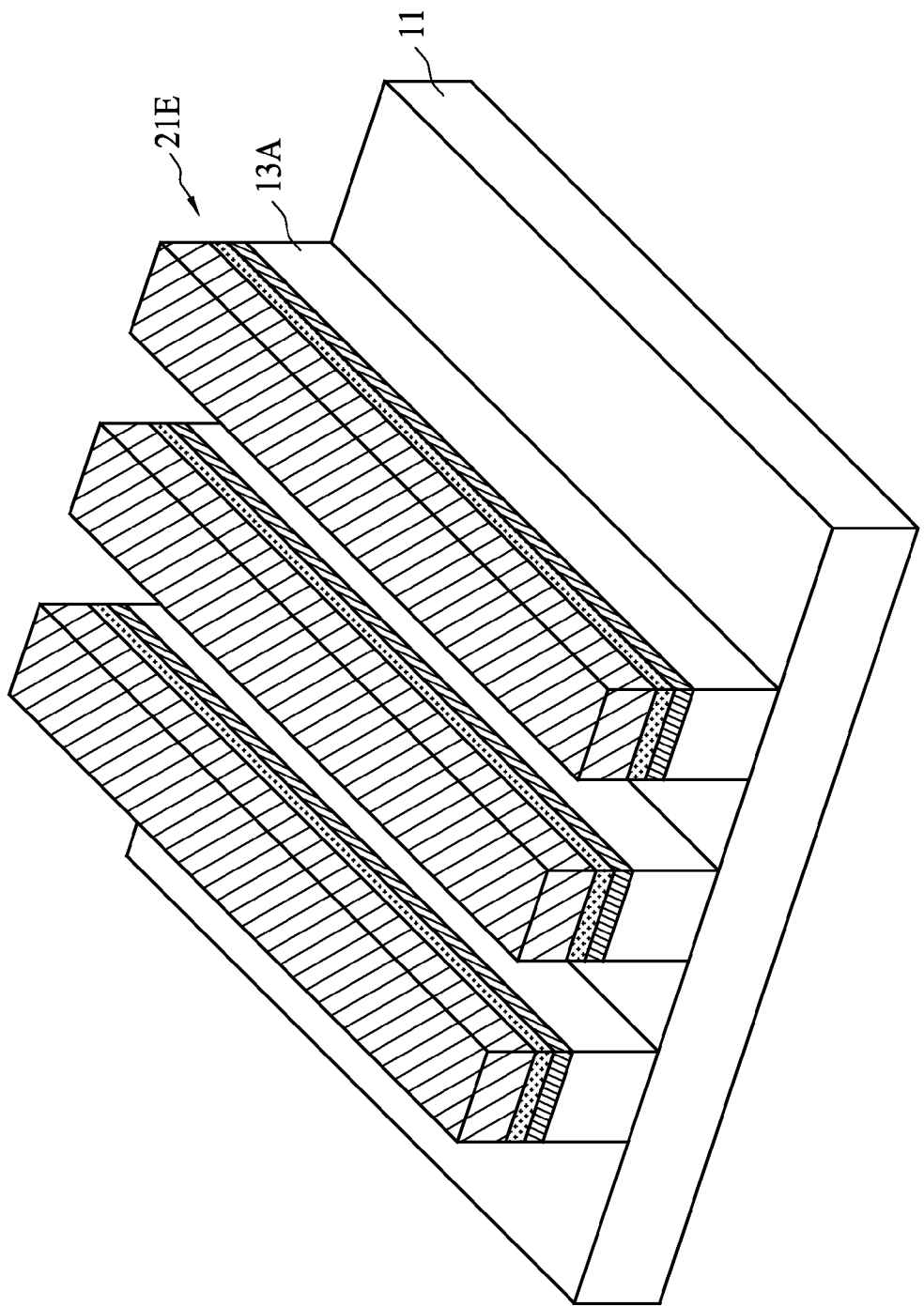
FIG. 26 to FIG. 28 illustrate a method for preparing the NAND flash memory structure according to one embodiment of the present disclosure.
Figure 27:
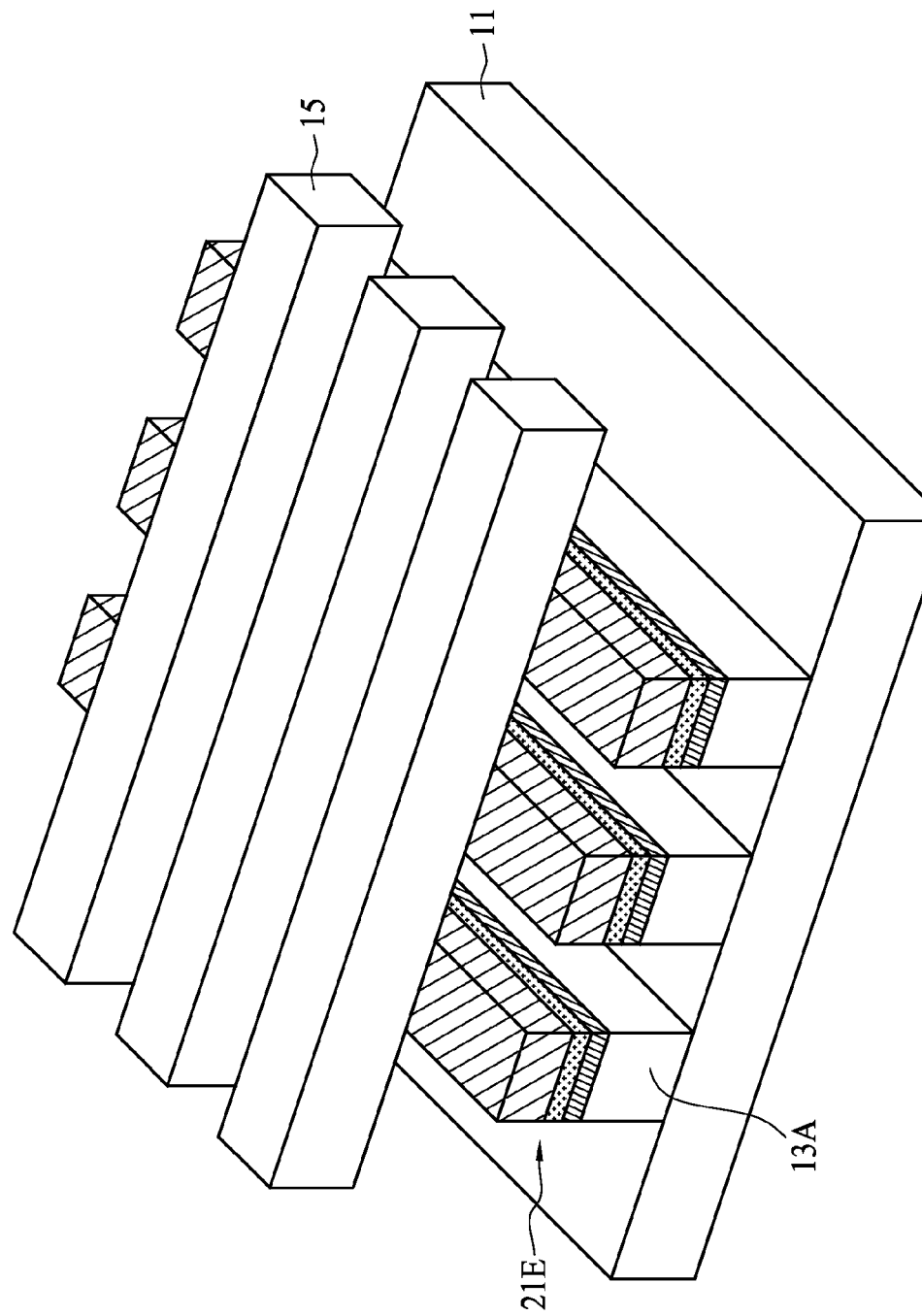
Figure 28:
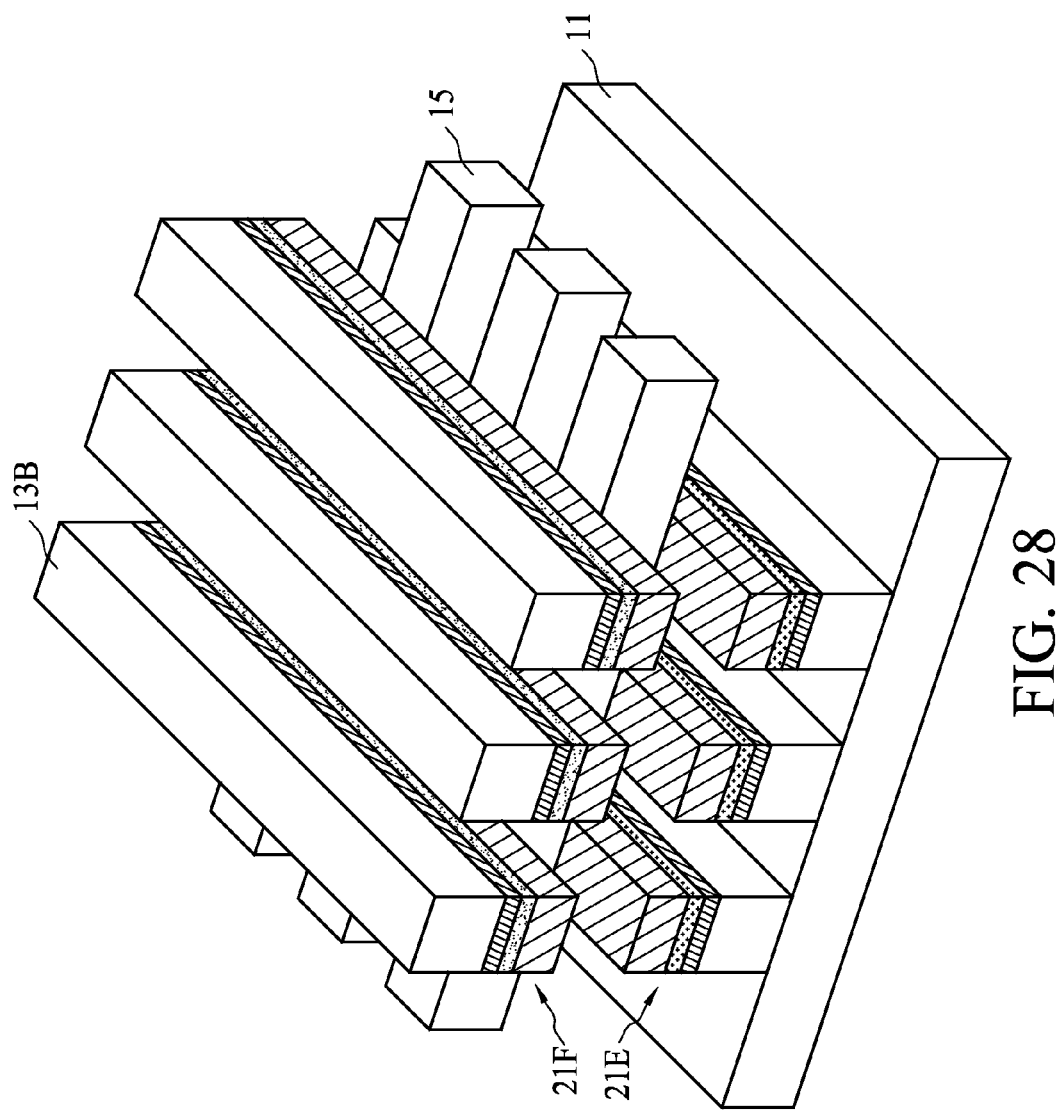

FIG. 26 to FIG. 28 illustrate a method for preparing the NAND flash memory structure 10E according to one embodiment of the present disclosure. For clearance purposes, the isolation material is omitted in FIG. 26 to FIG. 28. Referring to FIG. 26, in one embodiment of the present invention, fabrication processes including deposition, lithographic and etching processes are performed on a substrate 11 to form the first bitline 13A with the first charge-trapping stacks 21E thereon. Referring to FIG. 27, in one embodiment of the present invention, fabrication processes including deposition, lithographic and etching processes are performed on the first charge-trapping stacks 21E to form the wordlines lines 15. Referring to FIG. 28, in one embodiment of the present invention, fabrication processes including deposition, lithographic and etching processes are performed on the wordlines lines 15 to form the second charge-trapping stacks 21F with the second bitlines 13B thereon. In one embodiment of the present invention, the substrate 11 can be an insulating substrate or a plate with an insulating layer thereon, wherein the plate can comprise ceramics, silicon, metal, or glass such as quartz.

Figure 29:
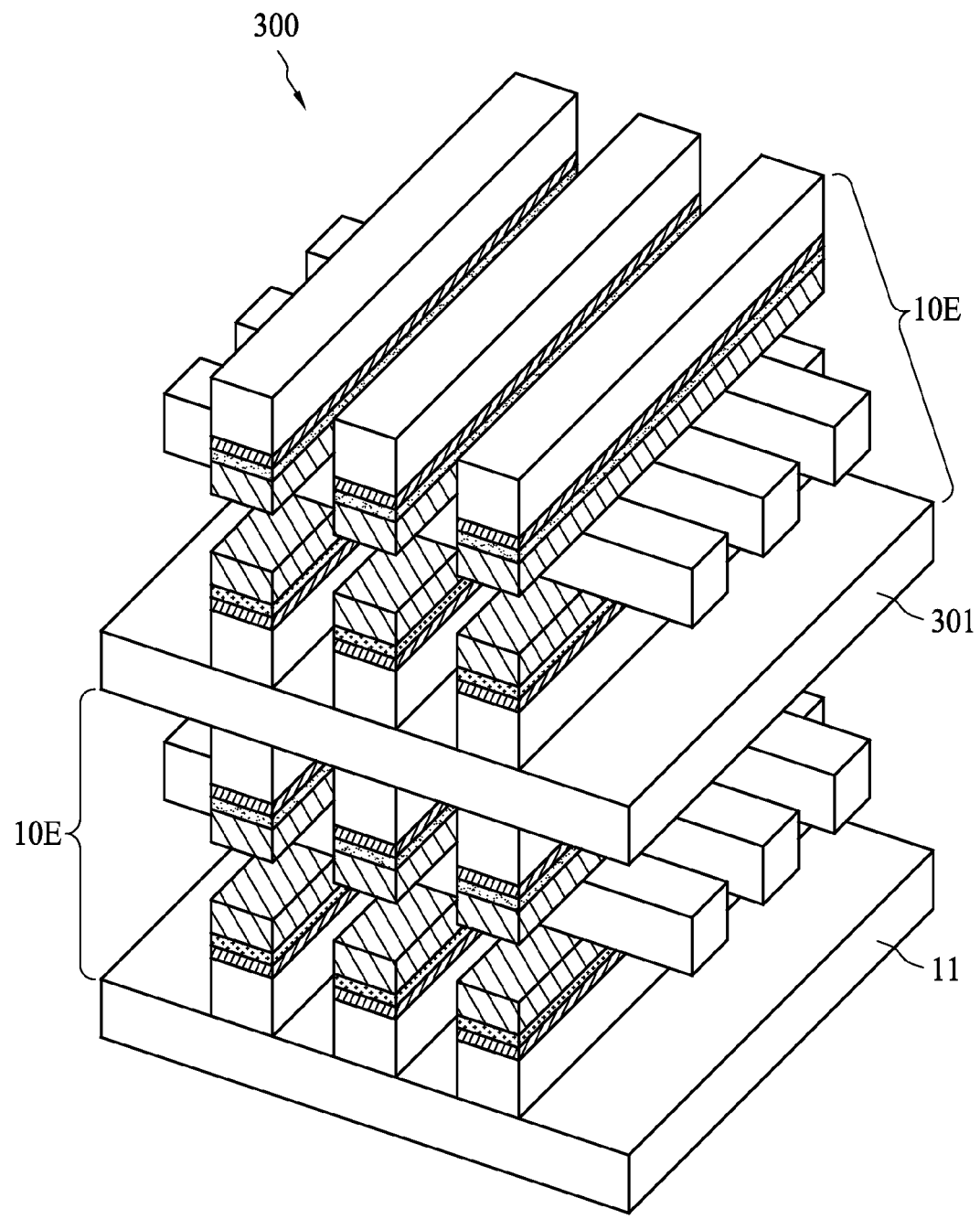
FIG. 29 illustrates a method for preparing a NAND flash memory according to one embodiment of the present disclosure.

FIG. 29 illustrates a method for preparing a NAND flash memory 300 according to one embodiment of the present disclosure. For clearance purposes, the isolation material is omitted in FIG. 29. In one embodiment of the present invention, the fabrication processes shown in FIG. 26 to FIG. 28 are performed to form a first NAND flash memory structure 10E on a substrate 11, and a deposition process is performed to form an insulating layer 301 covering the first NAND flash memory structure 10E. Subsequently, the fabrication processes shown in FIG. 26 to FIG. 28 are repeated to form a second NAND flash memory structure 10E on the insulating layer 301 so as to form the NAND flash memory 300 with the NAND flash memory structures 10E stacked along the third direction. In one embodiment of the present invention, the deposition process to form the insulating layer 301 and the fabrication processes shown in FIG. 26 to FIG. 28 can be further repeated to have more NAND flash memory structures 10C stacked vertically so as to increase the memory capacity of the NAND flash memory 300. In one embodiment of the present invention, the two memory structures 10E are arranged in a symmetrical manner with respect to the insulating layer 301.

Figure 30:
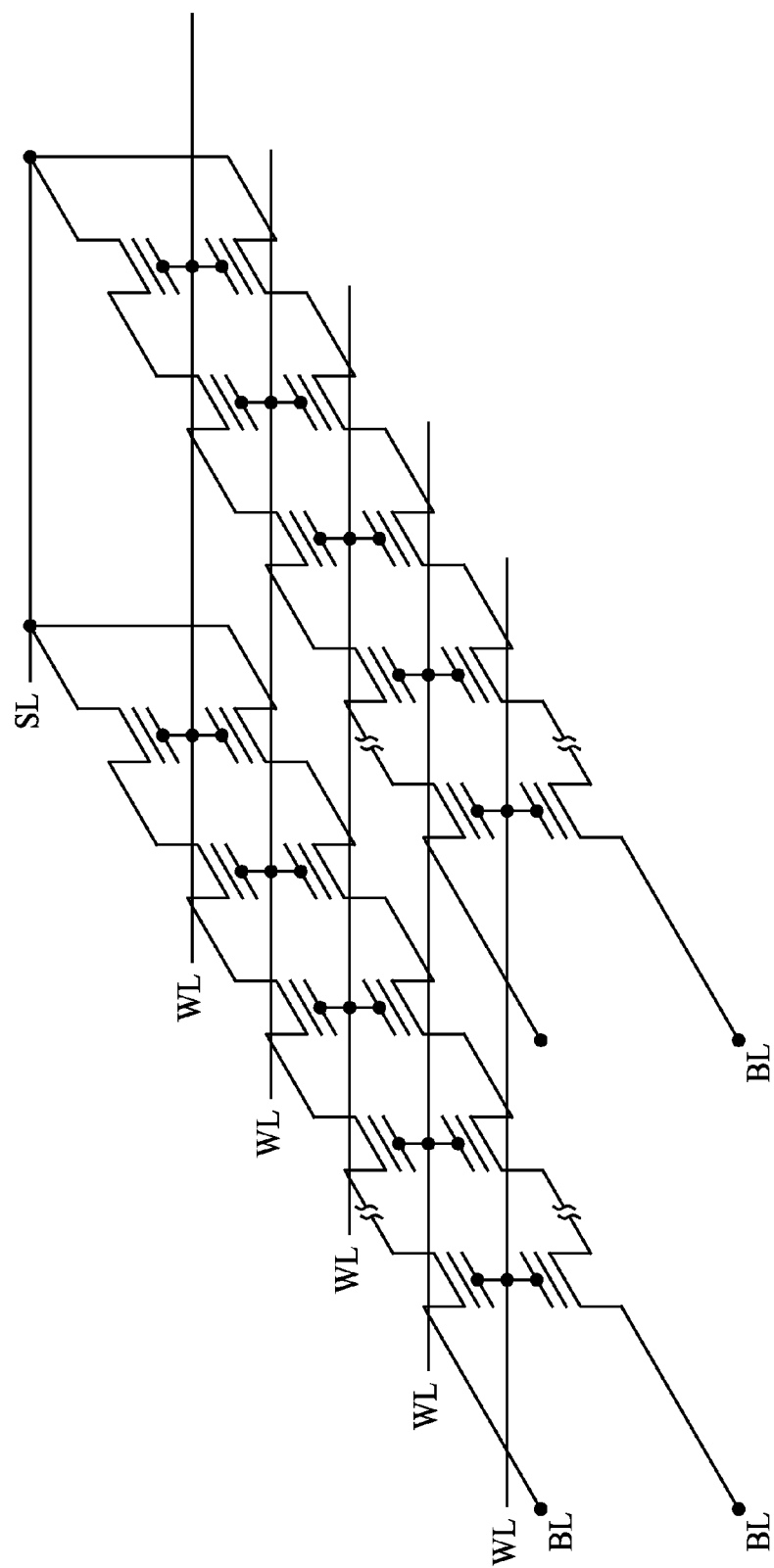
FIG. 30 illustrates an equivalent circuit corresponding to the NAND flash memory structure according to one embodiment of the present disclosure.

FIG. 30 illustrates an equivalent circuit corresponding to the NAND flash memory structure 10E according to one embodiment of the present disclosure. In one embodiment of the present invention, the programming operation of the NAND flash memory structure 10E is performed by grounding the corresponding bitline (BL) and applying a high voltage to the corresponding wordline (WL). In one embodiment of the present invention, the erasing operation of the NAND flash memory structure 10E is performed by grounding the corresponding wordline (WL) and applying a high voltage to the corresponding bitline (BL).

Figure 31:
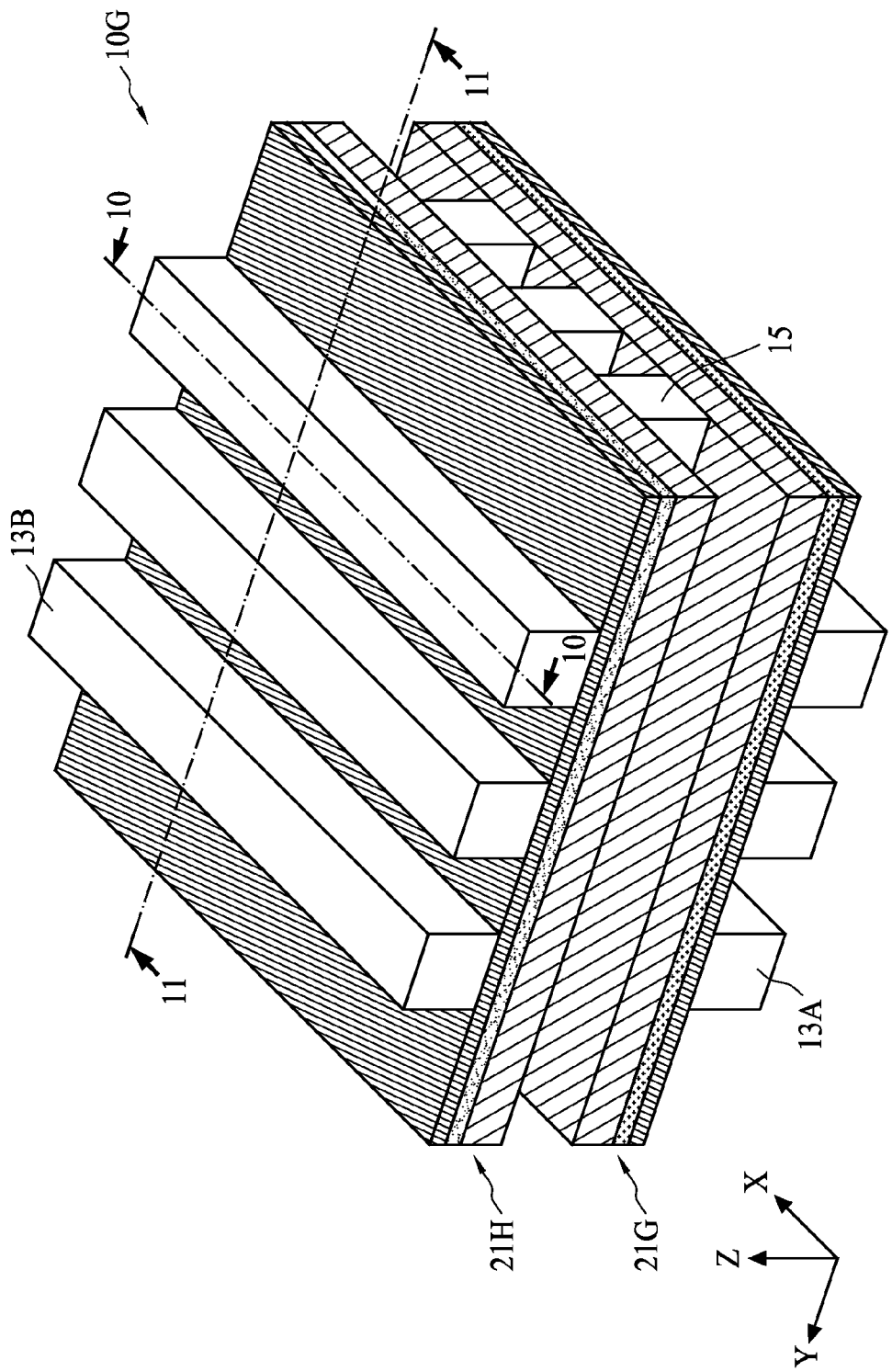
FIG. 31 illustrates a full view of a NAND flash memory structure according to one embodiment of the present disclosure.

FIG. 31 illustrates a full view of a NAND flash memory structure 10G according to one embodiment of the present disclosure. For clearance purposes, the isolation material is omitted in FIG. 31. In one embodiment of the present invention, the NAND flash memory structure 10G comprises a plurality of first bitlines 13A, a plurality of second bitlines 13B, a plurality of first charge-trapping stacks 21G over the first bitlines 13A, a plurality of second charge-trapping stacks 21H over the second bitlines 13B, and a plurality of wordlines 15 between the first charge-trapping stack 21G and the second charge-trapping stacks 21H.

In one embodiment of the present invention, both the first bitlines 13A and the second bitlines 13B extend along a first direction substantially in a horizontal manner, and the wordlines 15 extend along a second direction substantially in a horizontal manner. In one embodiment of the present invention, the first charge-trapping stack 21G extends along the first direction to cover at least two wordlines 15 or along the second direction to cover at least two first bitlines 13A. In one embodiment of the present invention, the second charge-trapping stack 21H extends along the first direction to cover at least two wordlines 15 or along the second direction to cover at least two first bitlines 13A.

Figure 32:
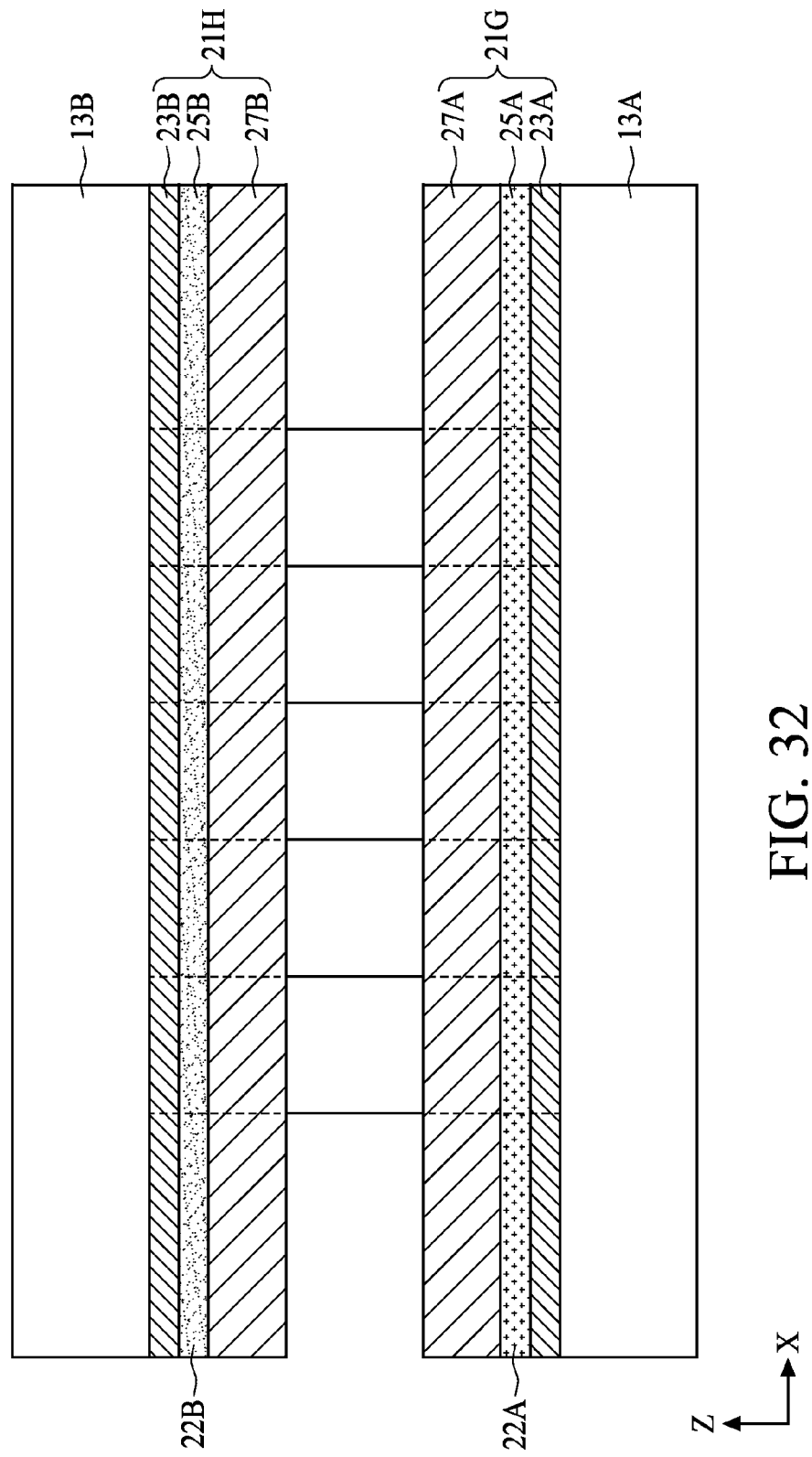
FIG. 32 illustrates a sectional view along line 10-10 in FIG. 31 according to one embodiment of the present disclosure.
Figure 33:
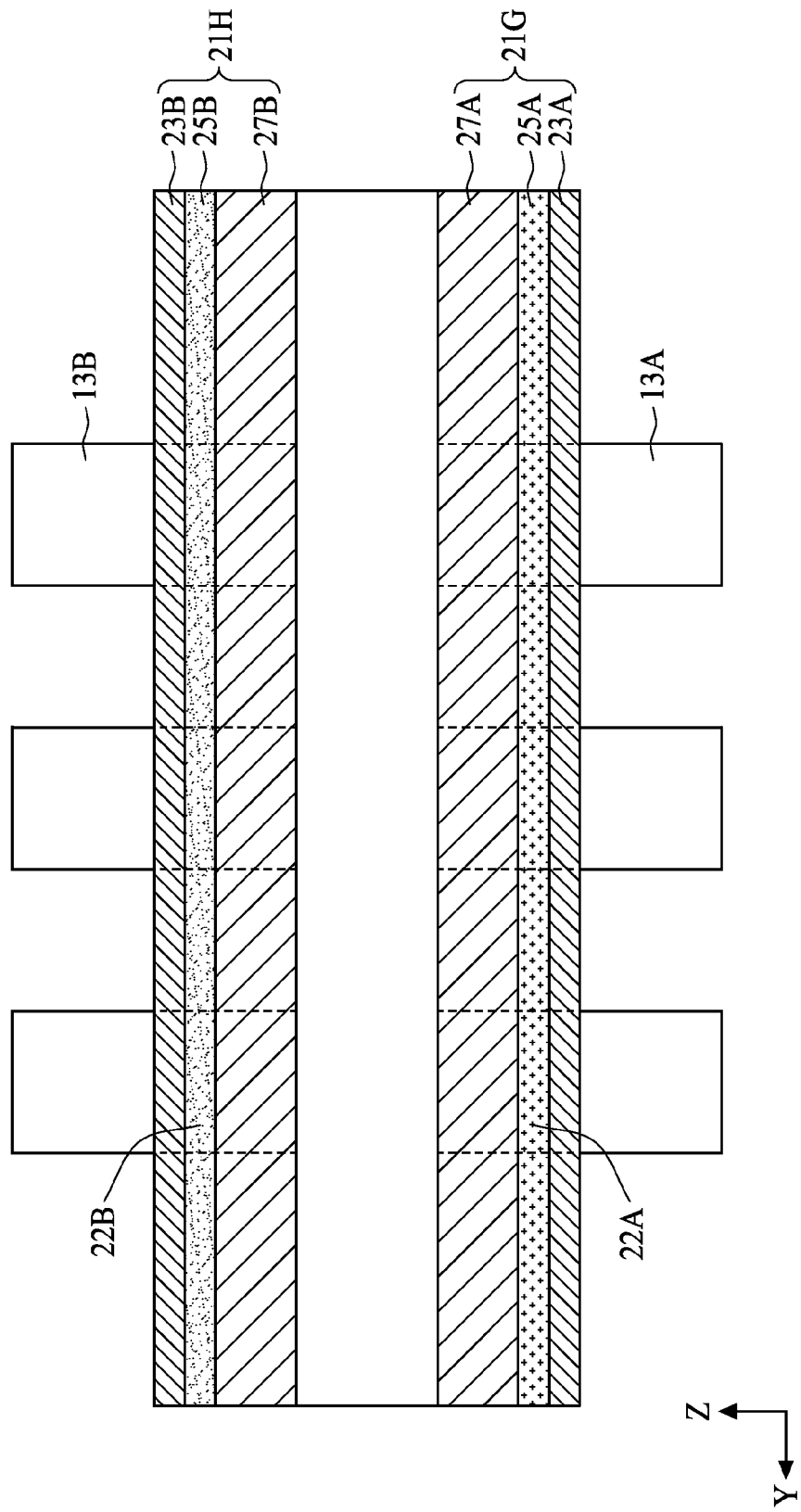
FIG. 33 illustrates a sectional view along line 11-11 in FIG. 31 according to one embodiment of the present disclosure.

FIG. 32 illustrates a sectional view along line 10-10 in FIG. 31 according to one embodiment of the present disclosure, and FIG. 33 illustrates a sectional view along line 11-11 in FIG. 31 according to one embodiment of the present disclosure. For clearance purposes, the isolation material is omitted in FIG. 32 and FIG. 33. In one embodiment of the present invention, the first charge-trapping stack 21G and the second charge-trapping stack 21H are arranged in a symmetrical manner with respect to the wordline 15. In one embodiment of the present invention, the first charge-trapping stack 21G comprises a first dielectric layer 23A, a second dielectric layer 27A, and an intervening layer 25A between the first dielectric layer 23A and the second dielectric layer 27A, wherein the intervening layer 25A is a dielectric layer or a quantum dot layer. In one embodiment of the present invention, the first charge-trapping stack 21G comprises a plurality of first charge-trapping regions 22A between the wordline 15 and one of the first bitlines 13A.

In one embodiment of the present invention, the first dielectric layer 23A and the second dielectric layer 27A are oxide layers, and the intervening layer 25A is a nitride layer. In one embodiment of the present invention, the quantum dot layer is implemented by a first material serving as a matrix and a second material serving as dots embedded in the matrix, wherein the energy gap of the first material is greater than that of the second material. In one embodiment of the present invention, the thickness of the first dielectric layer 23A is less than that of the second dielectric layer 27A.

In one embodiment of the present invention, the second charge-trapping stack 21H comprises a first dielectric layer 23B, a second dielectric layer 27B, and an intervening layer 25B between the first dielectric layer 23B and the second dielectric layer 27B, wherein the intervening layer 25B is a dielectric layer or a quantum dot layer. In one embodiment of the present invention, the second charge-trapping stack 21H comprises a plurality of second charge-trapping regions 22B between the wordline 15 and one of the second bitlines 13B.

In one embodiment of the present invention, the first dielectric layer 23B and the second dielectric layer 27B are oxide layers, and the intervening layer 25B is a nitride layer. In one embodiment of the present invention, the quantum dot layer is implemented by a first material serving as a matrix and a second material serving as dots embedded in the matrix, wherein the energy gap of the first material is greater than that of the second material. In one embodiment of the present invention, the thickness of the first dielectric layer 23A is less than that of the second dielectric layer 27A.

In one embodiment of the present invention, the first charge-trapping region 22A and the second charge-trapping region 22B are stacked along a third direction, which is substantially perpendicular to the first direction, as shown in FIG. 32. In one embodiment of the present invention, the first charge-trapping region 22A and the second charge-trapping region 22B are stacked along the third direction, which is substantially perpendicular to the second direction, as shown in FIG. 33.

Referring to FIG. 33, in one embodiment of the present invention, the first bitline 13A and the second bitline 13B are aligned vertically, i.e., aligned along the third direction. Similarly, in one embodiment of the present invention, the first charge-trapping region 22A and the second charge-trapping region 22B are aligned vertically, i.e., aligned along the third direction. In one embodiment of the present invention, the space between the first bitlines 13A is between 20 nm and 25 nm. In one embodiment of the present invention, the memory structure 10G comprises a first carrier channel positioned substantially in a horizontal manner in the first bitline 13A close to the first charge-trapping stack 21G, and a second carrier channel positioned substantially in a horizontal manner in the second bitline 13B close to the second charge-trapping stack 21H.

Figure 34:
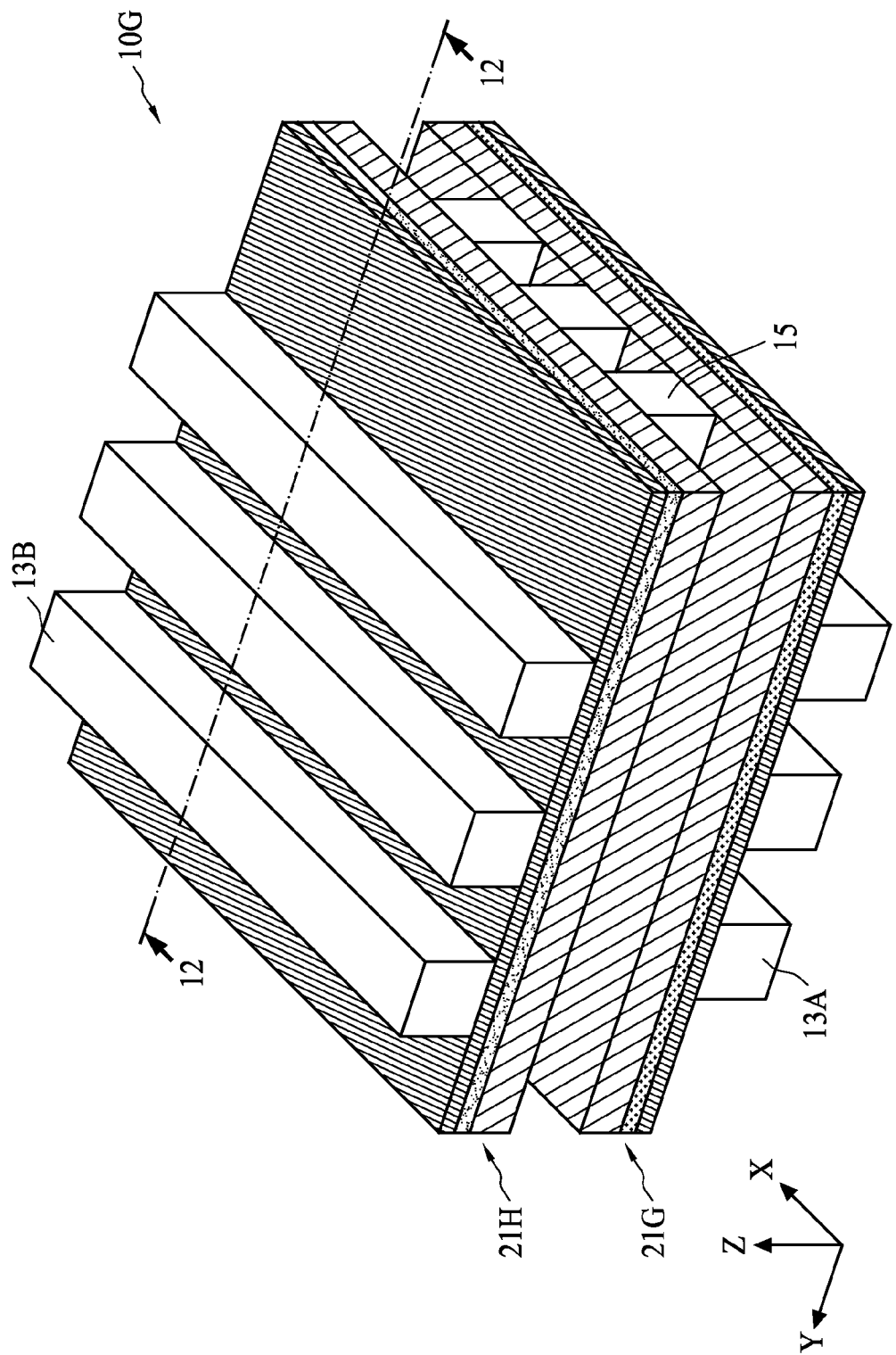
FIG. 34 illustrates a full view of a NAND flash memory structure according to one embodiment of the present disclosure.
Figure 35:
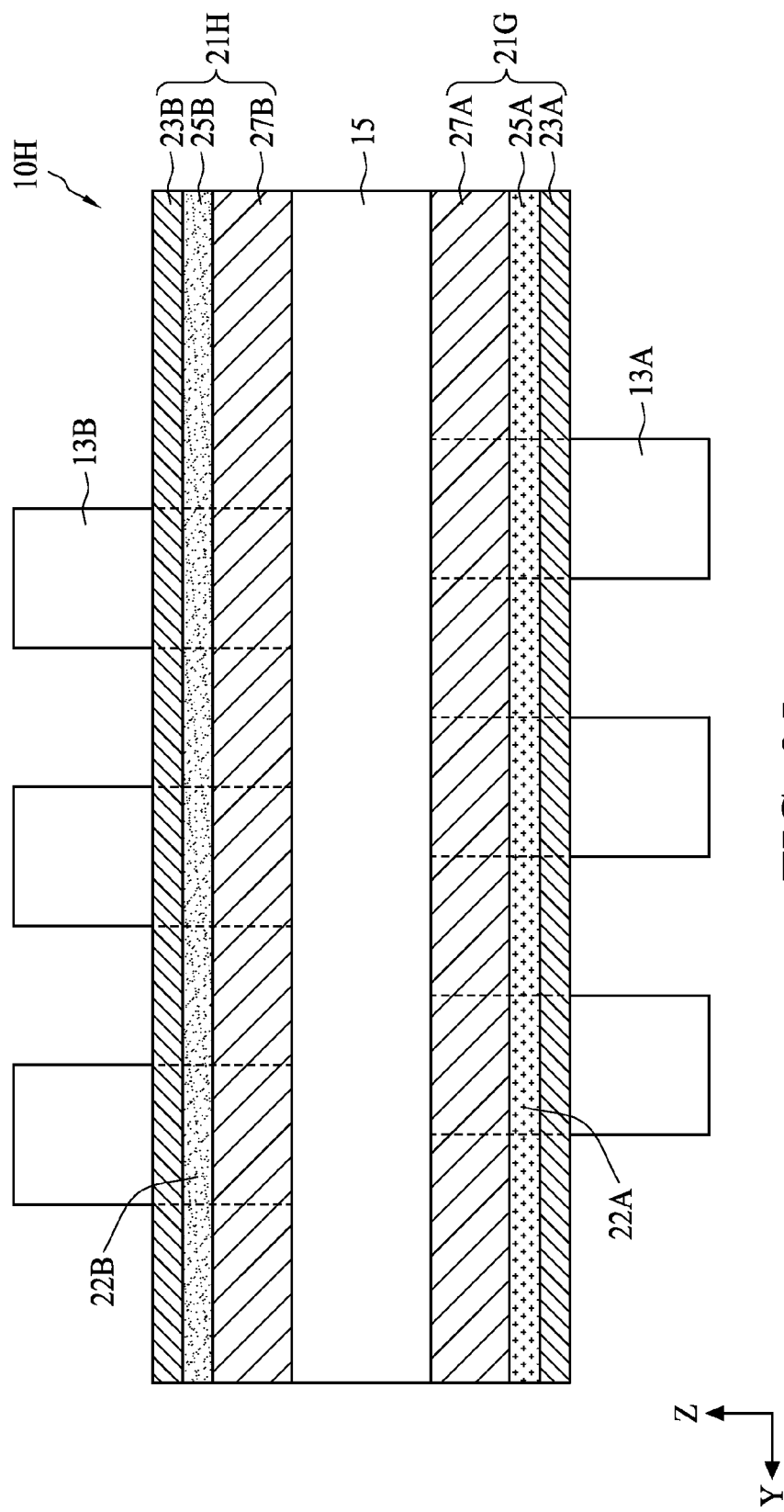
FIG. 35 illustrates a sectional view along line 12-12 in FIG. 34 according to one embodiment of the present disclosure.

FIG. 34 illustrates a full view of a NAND flash memory structure 10H according to one embodiment of the present disclosure, and FIG. 35 illustrates a sectional view along line 12-12 in FIG. 34 according to one embodiment of the present disclosure. For clearance purposes, the isolation material is omitted in FIG. 34 and FIG. 35. In FIG. 33, the first bitline 13A and the second bitline 13B are aligned vertically; in contrast, in FIG. 34 the first bitline 13A and the second bitline 13B are positioned in a staggered manner along the third direction. Furthermore, in FIG. 33, the first charge-trapping region 22A and the second charge-trapping region 22B are aligned vertically, whereas in FIG. 34 the first charge-trapping region 22A and the second charge-trapping region 22B are positioned in a staggered manner along the third direction.

Figure 36:
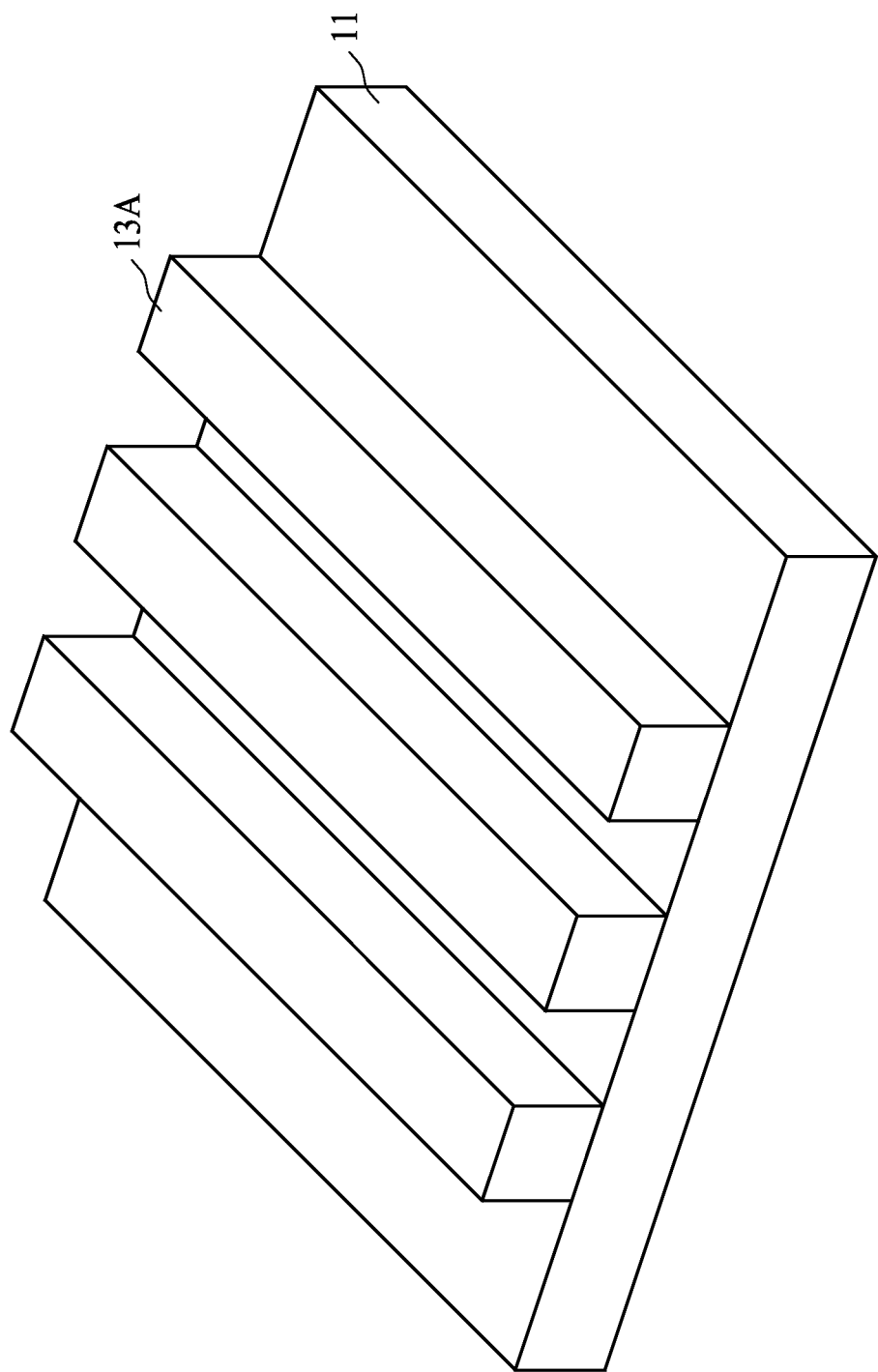
FIG. 36 to FIG. 38 illustrate a method for preparing the NAND flash memory structure according to one embodiment of the present disclosure.
Figure 37:
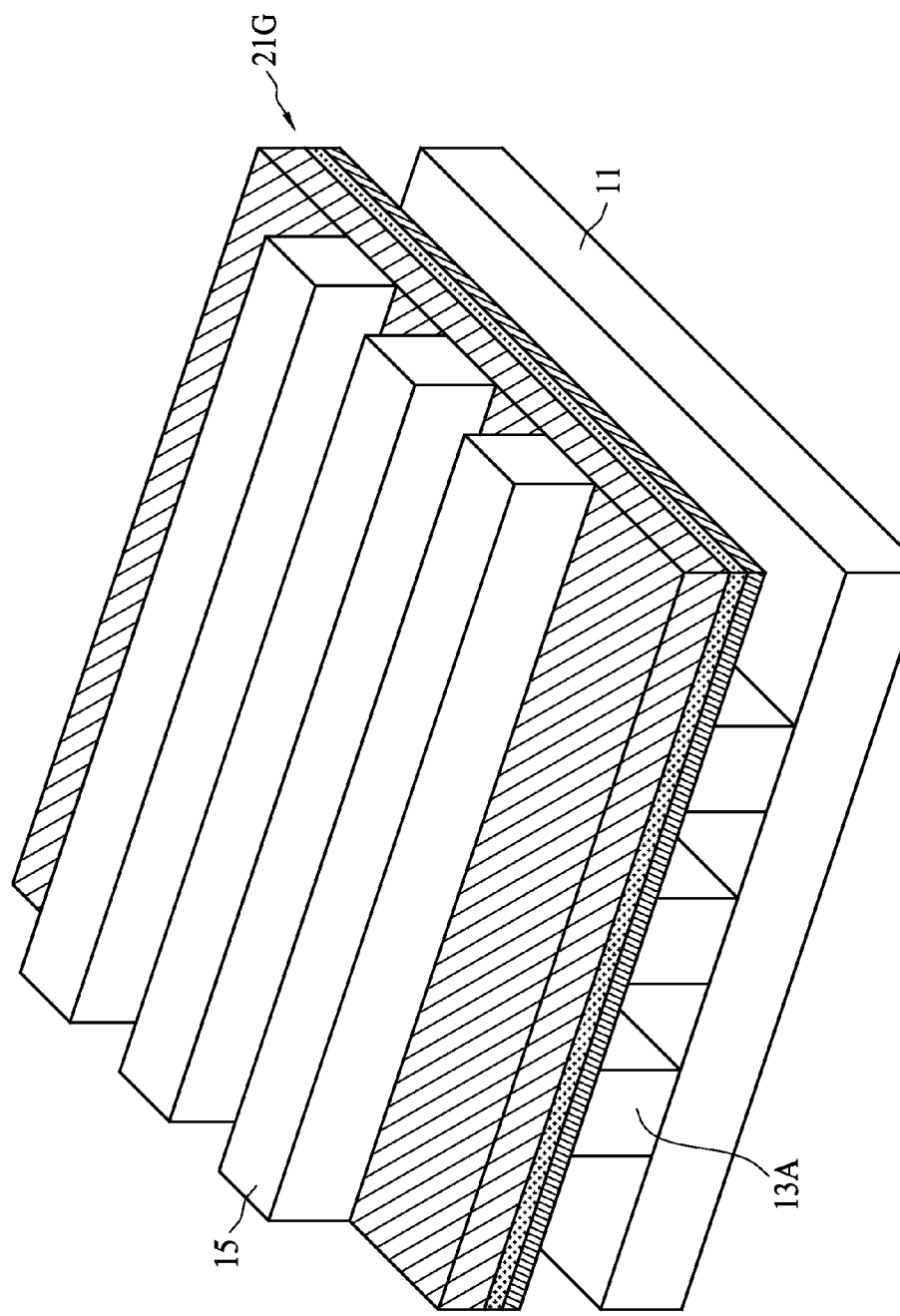
Figure 38:
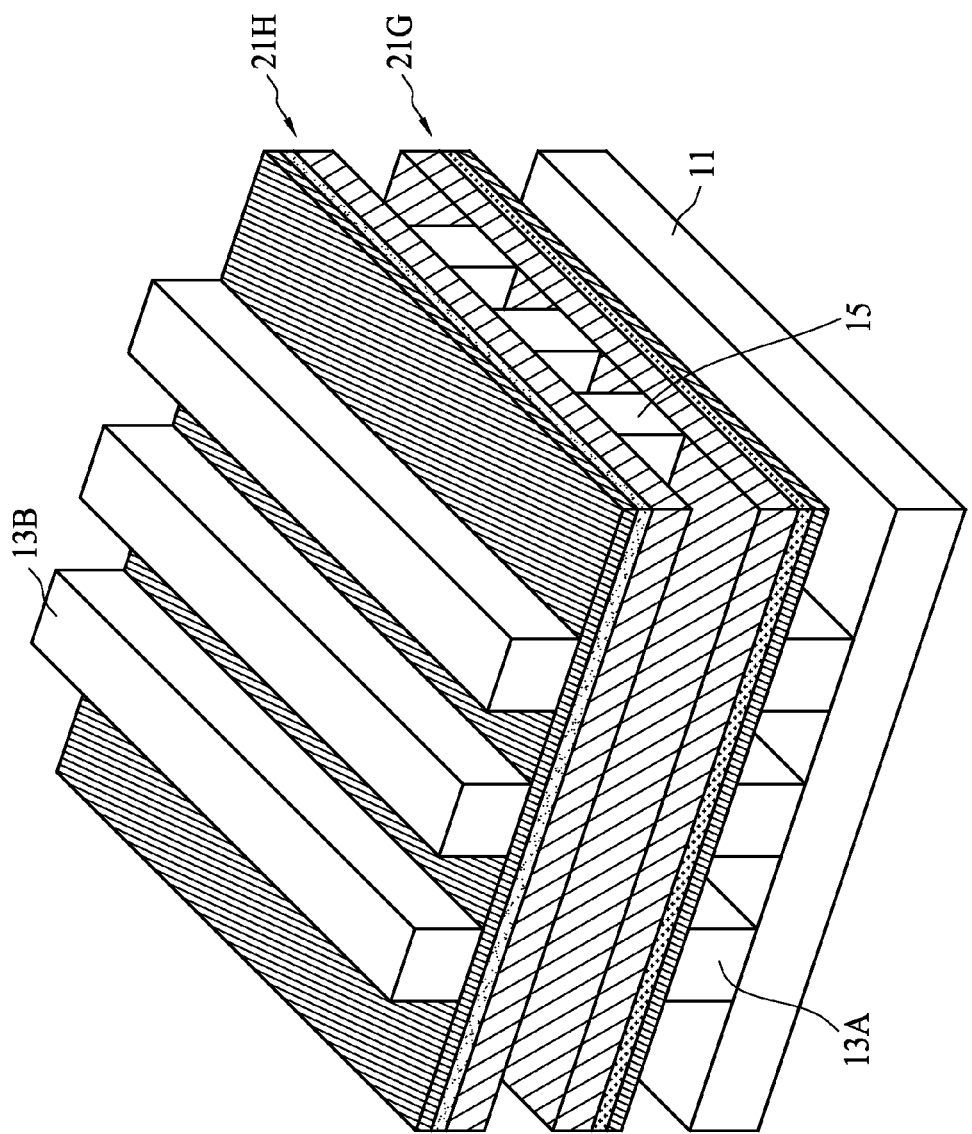

FIG. 36 to FIG. 38 illustrate a method for preparing the NAND flash memory structure 10G according to one embodiment of the present disclosure. For clearance purposes, the isolation material is omitted in FIG. 36 to FIG. 38. Referring to FIG. 36, in one embodiment of the present invention, fabrication processes including deposition, lithographic and etching processes are performed on a substrate 11 to form the first bitline 13A. Referring to FIG. 37, in one embodiment of the present invention, fabrication processes including deposition, lithographic and etching processes are performed on the first bitlines 13A to form the first charge-trapping stack 21G with the wordlines lines 15 thereon. Referring to FIG. 38, in one embodiment of the present invention, fabrication processes including deposition, lithographic and etching processes are performed on the wordlines lines 15 to form the second charge-trapping stack 21H with the second bitlines 13B thereon. In one embodiment of the present invention, the substrate 11 can be an insulating substrate or a plate with an insulating layer thereon, wherein the plate can comprise ceramics, silicon, metal, or glass such as quartz.

Figure 39:
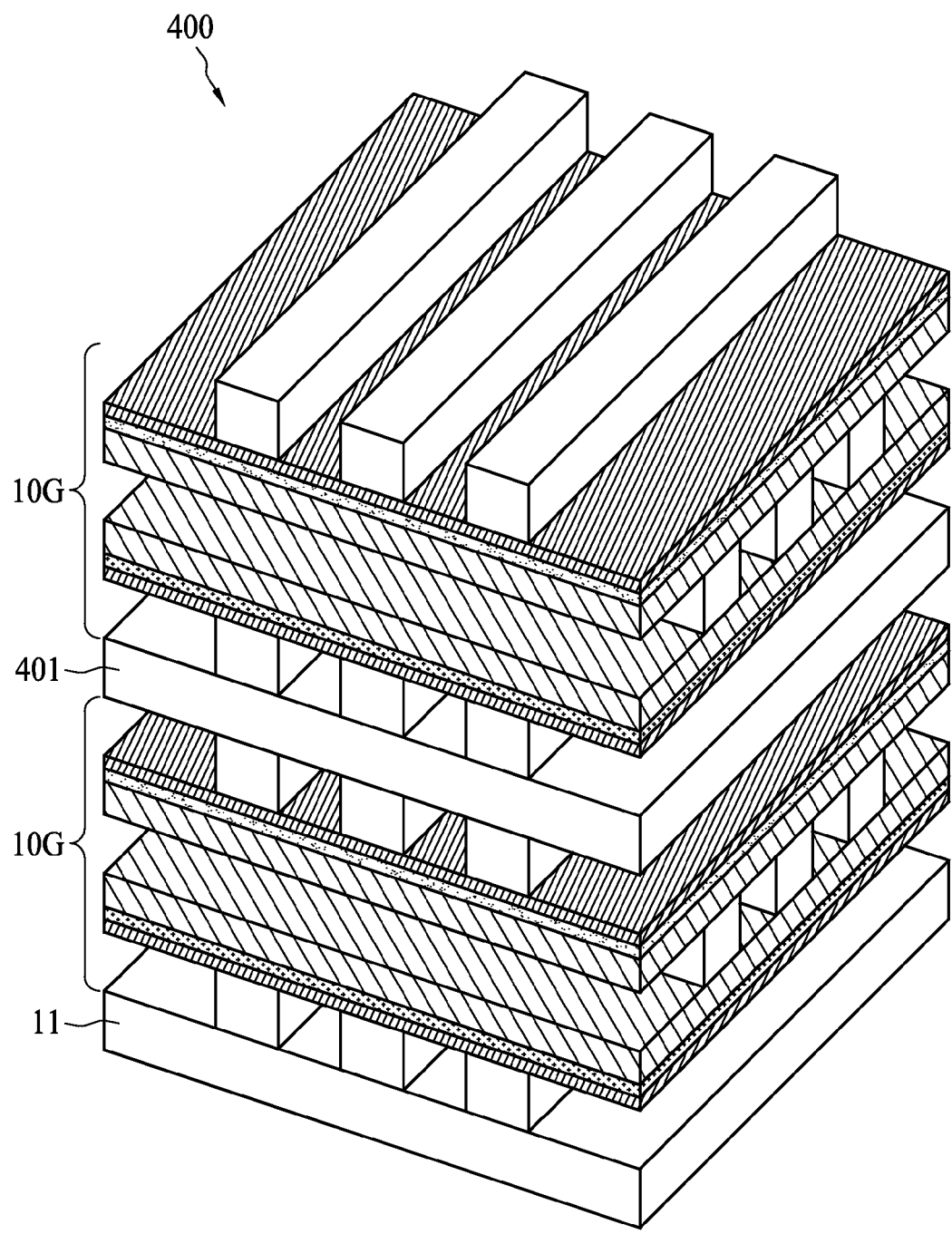
FIG. 39 illustrates a method for preparing a NAND flash memory according to one embodiment of the present disclosure.

FIG. 39 illustrates a method for preparing a NAND flash memory 400 according to one embodiment of the present disclosure. For clearance purposes, the isolation material is omitted in FIG. 29. In one embodiment of the present invention, the fabrication processes shown in FIG. 36 to FIG. 38 are performed to form a first NAND flash memory structure 10G on a substrate 11, and a deposition process is performed to form an insulating layer 401 covering the first NAND flash memory structure 10G. Subsequently, the fabrication processes shown in FIG. 36 to FIG. 38 are repeated to form a second NAND flash memory structure 10G on the insulating layer 301 so as to form the NAND flash memory 400 with the NAND flash memory structures 10G stacked along the third direction. In one embodiment of the present invention, the deposition process to form the insulating layer 401 and the fabrication processes shown in FIG. 36 to FIG. 38 can be further repeated to have more NAND flash memory structures 10C stacked vertically so as to increase the memory capacity of the NAND flash memory 400. In one embodiment of the present invention, the two memory structures 10G are arranged in a symmetrical manner with respect to the insulating layer 401.

Figure 40:
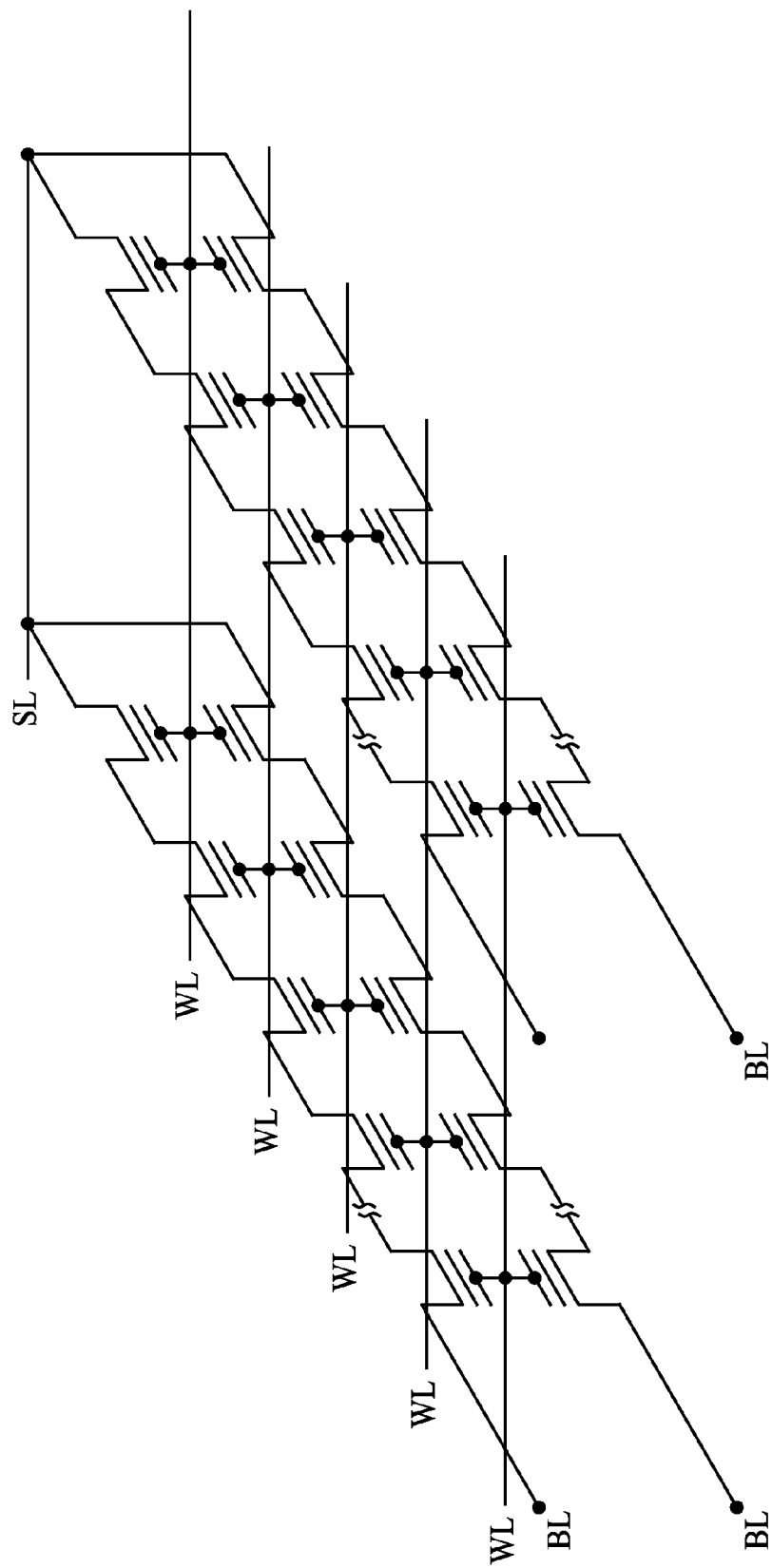
FIG. 40 illustrates an equivalent circuit corresponding to the NAND flash memory structure according to one embodiment of the present disclosure.

FIG. 40 illustrates an equivalent circuit corresponding to the NAND flash memory structure 10G according to one embodiment of the present disclosure. In one embodiment of the present invention, the programming operation of the NAND flash memory structure 10G is performed by grounding the corresponding bitline (BL) and applying a high voltage to the corresponding wordline (WL). In one embodiment of the present invention, the erasing operation of the NAND flash memory structure 10E is performed by grounding the corresponding wordline (WL) and applying a high voltage to the corresponding bitline (BL).

In one embodiment of the present invention, one of ordinary skill in the art will readily appreciate from the above disclosure that the charge-trapping stack below the wordline may be different from the charge-trapping stack above the wordline; in other words, the first charge-trapping stack and the second charge-trapping stack can be arranged in an asymmetrical manner with respect to the wordline. For example, the first charge-trapping stack below the wordline may use the one shown in FIG. 1, while the second charge-trapping stack above the wordline may use the one shown in FIG. 11, FIG. 21 or FIG. 31; the first charge-trapping stack below the wordline may use the one shown in FIG. 11, while the second charge-trapping stack above the wordline may use the one shown in FIG. 1, FIG. 21 or FIG. 31; the first charge-trapping stack below the wordline may use the one shown in FIG. 21, while the second charge-trapping stack above the wordline may use the one shown in FIG. 1, FIG. 11 or FIG. 31; the first charge-trapping stack below the wordline may use the one shown in FIG. 31, while the second charge-trapping stack above the wordline may use the one shown in FIG. 1, FIG. 11 or FIG. 21.

In one embodiment of the present invention, one of ordinary skill in the art will readily appreciate from the above disclosure that the memory structure below the insulating layer may be different from the memory structure above the insulating layer; in other words, the memory structures are arranged in an asymmetrical manner with respect to the insulating layer. For example, the first memory structure below the insulating layer may use the one shown in FIG. 1, while the second memory structure above the insulating layer may use the one shown in FIG. 11, FIG. 21 or FIG. 31; the first memory structure below the insulating layer may use the one shown in FIG. 11, while the second memory structure above the insulating layer may use the one shown in FIG. 1, FIG. 21 or FIG. 31; the first memory structure below the insulating layer may use the one shown in FIG. 21, while the second memory structure above the insulating layer may use the one shown in FIG. 1, FIG. 11 or FIG. 31; the first memory structure below the insulating layer may use the one shown in FIG. 31, while the second memory structure above the insulating layer may use the one shown in FIG. 1, FIG. 11 or FIG. 21.

The conventional 3-dimensional memory designs implement the charge-trapping structure by the ONO stack laterally, requiring a very complicated fabrication process. In contrast, in one embodiment of the present disclosure, the charge-trapping structure is vertically aligned, allowing a relatively simple fabrication process.

The thickness of the ONO stack serving as the charge-trapping structure is not a scalable parameter, and the it is not feasible to increase the memory density of the conventional 3-dimensional memory designs by decreasing the thickness of the ONO stack. In contrast, in one embodiment of the present disclosure, the charge-trapping structure is implemented in a vertically aligned manner, allowing repeating of the fabrication process to increase the memory capacity.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A NAND flash memory, comprising at least one memory structure including:
   a plurality of first bitlines and a plurality of second bitlines extending along a first direction;
   a plurality of first charge-trapping stacks positioned over the first bitline, wherein each of the plurality of first charge-trapping stacks has at least one first charge-trapping region, and the plurality of first charge-trapping stacks are separated from each other;
   a plurality of second charge-trapping stacks positioned below the second bitlines, wherein each of the plurality of second charge-trapping stacks has at least one second charge-trapping region, and the plurality of second charge-trapping stacks are separated from each other; and
   a plurality of wordlines positioned between the first charge-trapping stacks and the second charge-trapping stacks, wherein the plurality of wordlines extending along a second direction;
   wherein the plurality of first charge-trapping region and the plurality of second charge-trapping region are stacked along a third direction substantially perpendicular to the first direction and the second direction.

2. The NAND flash memory of claim 1, wherein the plurality of first bitline and the plurality of second bitline are aligned along the third direction.

3. The NAND flash memory of claim 1, wherein the plurality of first bitline and the plurality of second bitline are positioned in a staggered manner along the third direction.

4. The NAND flash memory of claim 1, wherein the plurality of first charge-trapping region and the plurality of second charge-trapping region are aligned along the third direction.

5. The NAND flash memory of claim 1, wherein the plurality of first charge-trapping region and the plurality of second charge-trapping region are positioned in a staggered manner along the third direction.

6. The NAND flash memory of claim 1, wherein the plurality of first charge-trapping stacks are positioned in an array manner.

7. The NAND flash memory of claim 1, wherein at least one of the plurality of first charge-trapping stack and at least one of the plurality of the second charge-trapping stack comprise a first dielectric layer, a second dielectric layer, and an intervening layer between the first dielectric layer and the second dielectric layer, wherein the intervening layer is a semiconductor layer, a metal layer, a dielectric layer, or a quantum dot layer.

8. The NAND flash memory of claim 1, wherein the plurality of first bitline and the plurality of second bitline extend along the first direction substantially in a horizontal manner, and the plurality of wordlines extend along the second direction substantially in a horizontal manner.

9. The NAND flash memory of claim 1, wherein the plurality of first charge-trapping stacks and the plurality of second charge-trapping stacks are arranged in a symmetrical manner with respect to the plurality of wordlines.

10. The NAND flash memory of claim 1, comprising a plurality of memory structures separated by an insulating layer.

11. The NAND flash memory of claim 10, wherein the plurality of memory structures are stacked along the third direction.

12. The NAND flash memory of claim 10, wherein the plurality of memory structures are arranged in a symmetrical manner with respect to the insulating layer.

13. The NAND flash memory of claim 10, wherein the plurality of memory structures are arranged in an asymmetrical manner with respect to the insulating layer.

14. The NAND flash memory of claim 1, wherein the memory structure comprises a first carrier channel positioned substantially in a horizontal manner and a second carrier channel positioned substantially in a horizontal manner.

* * * * *